(12) United States Patent
Saito et al.

(10) Patent No.: US 7,754,534 B2
(45) Date of Patent: *Jul. 13, 2010

(54) SEMICONDUCTOR DEVICE AND MANUFACTURING METHOD THEREOF

(75) Inventors: Nobukatsu Saito, Kawasaki (JP); Masaharu Minamizawa, Kawasaki (JP); Yoshiyuki Yoneda, Kawasaki (JP); Nobutaka Shimizu, Kawasaki (JP); Kazuyuki Imamura, Kawasaki (JP); Atsushi Kikuchi, Kawasaki (JP); Tadahiro Okamoto, Kawasaki (JP); Eiji Watanabe, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 1 day.

This patent is subject to a terminal disclaimer.

(21) Appl. No.: 12/081,723

(22) Filed: Apr. 21, 2008

(65) Prior Publication Data

US 2008/0261336 A1 Oct. 23, 2008

Related U.S. Application Data

(62) Division of application No. 10/878,206, filed on Jun. 29, 2004, now abandoned, which is a division of application No. 10/331,560, filed on Dec. 31, 2002, now Pat. No. 6,794,273.

(30) Foreign Application Priority Data

May 24, 2002 (JP) .............................. 2002-151050
Aug. 13, 2002 (JP) .............................. 2002-235524

(51) Int. Cl.
*H01L 21/00* (2006.01)

(52) U.S. Cl. ................. 438/118; 257/620; 257/E21.37; 257/E23.106; 438/120; 438/462

(58) Field of Classification Search ................. 257/620, 257/707, E21.37, E23.106; 438/118, 120, 438/462
See application file for complete search history.

(56) References Cited

U.S. PATENT DOCUMENTS 5,886,408 A 3/1999 Ohki et al.

(Continued)

FOREIGN PATENT DOCUMENTS

CN 1312347 A 9/2001

(Continued)

OTHER PUBLICATIONS

Chinese Office Action dated Oct. 19, 2007, issued in corresponding Chinese Application No. 200610089954X.

(Continued)

*Primary Examiner*—Wael M Fahmy
*Assistant Examiner*—John C Ingham
(74) *Attorney, Agent, or Firm*—Westerman, Hattori, Daniels & Adrian, LLP

(57) ABSTRACT

A method of manufacturing a semiconductor device using a wiring substrate is provided which can facilitate the handling of the wiring substrate. The method includes the steps of forming a peelable resin layer on a silicon substrate, forming the wiring substrate on the peelable resin layer, mounting semiconductor chips on the wiring substrate, forming semiconductor devices by sealing the plurality of semiconductor chips by a sealing resin, individualizing the semiconductor devices by dicing the semiconductor devices from the sealing resin side but leaving the silicon substrate, peeling each of the individualized semiconductor devices from the silicon substrate between the silicon substrate and the peelable resin layer, and exposing terminals on the wiring substrate by forming openings through the peelable resin layer or by removing the peelable resin layer.

27 Claims, 41 Drawing Sheets

U.S. PATENT DOCUMENTS

| | | |
|---|---|---|
| 5,950,070 A | 9/1999 | Razon et al. |
| 6,146,686 A * | 11/2000 | Leitao ........................ 427/2.27 |
| 6,222,265 B1 | 4/2001 | Akram et al. |
| 6,488,803 B2 | 12/2002 | Kiuchi et al. |
| 6,558,478 B1 * | 5/2003 | Katakabe et al. ............... 134/33 |
| 6,607,970 B1 | 8/2003 | Wakabayashi |
| 6,627,998 B1 | 9/2003 | Caletka et al. |
| 6,656,820 B2 * | 12/2003 | Liu ............................ 438/460 |
| 6,744,135 B2 | 6/2004 | Hasebe |
| 6,794,273 B2 * | 9/2004 | Saito et al. .................. 438/462 |
| 6,861,757 B2 | 3/2005 | Shimoto et al. |
| 6,959,863 B2 * | 11/2005 | Figuet et al. ................. 235/449 |
| 2003/0162386 A1 * | 8/2003 | Ogawa et al. ............... 438/637 |

FOREIGN PATENT DOCUMENTS

| | | |
|---|---|---|
| JP | 2000-353765 A | 12/2000 |
| JP | 2002-164467 | 6/2002 |

OTHER PUBLICATIONS

Japanese Office Action dated Aug. 29, 2006 (mailing date), issued in corresponding Japanese Patent Application No. 2002-235524.
Japanese Office Action dated May 30, 2006, issued in corresponding Japanese Patent Application No. 2002-235524.
Chinese Office Action dated Aug. 6, 2004, issued in corresponding Chinese Application No. 03120430.9.

* cited by examiner $H_R < H_M$

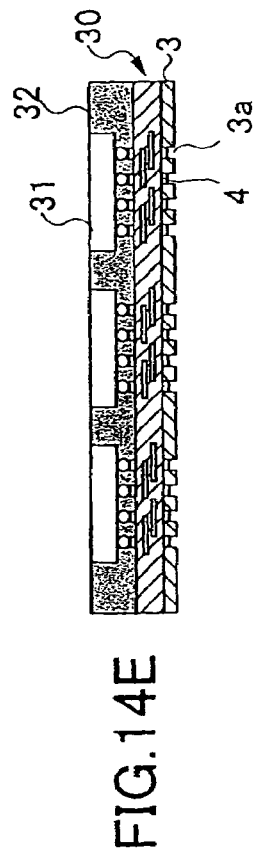
FIG.14E
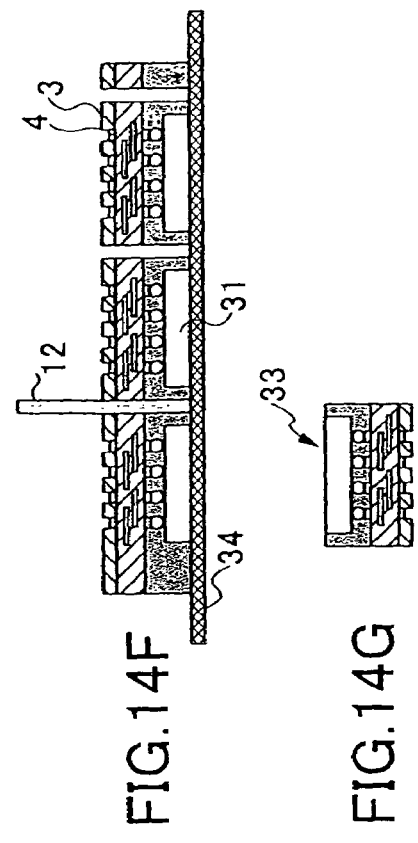
FIG.14F
FIG.14G
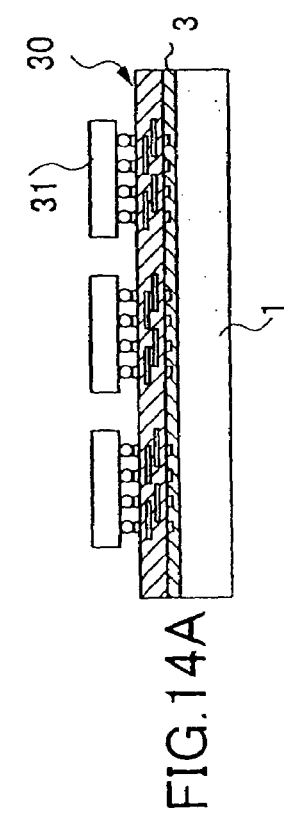
FIG.14A
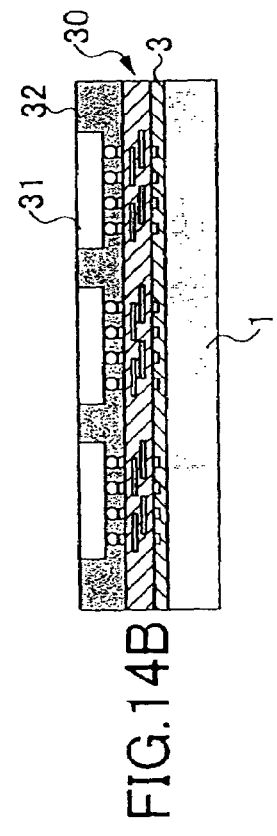
FIG.14B
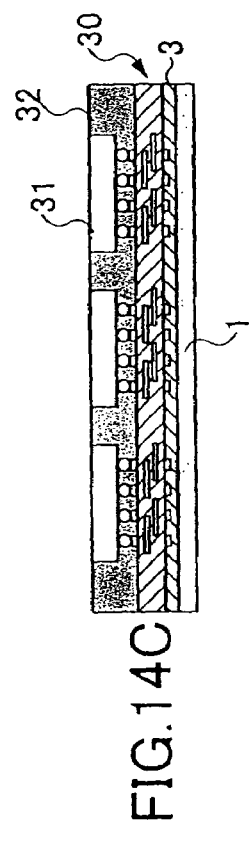
FIG.14C
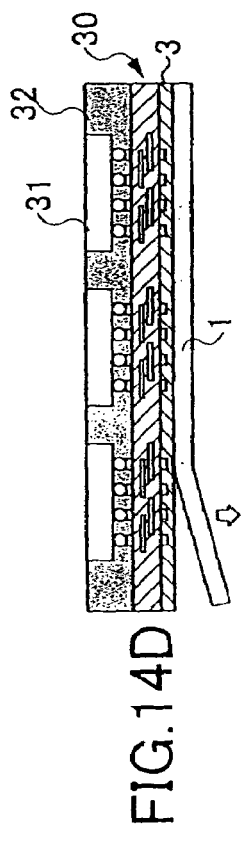
FIG.14D

BACK GRIND

BACK GRIND

BACK GRINDING

BACK GRINDING

LASER BEAM

SEMICONDUCTOR DEVICE AND MANUFACTURING METHOD THEREOF

This application is a division of prior U.S. application Ser. No. 10/878,206, which is a division of prior application Ser. No. 10/331,560, filed Dec. 31, 2002.

BACKGROUND OF THE INVENTION

1. Field of the Invention

The present invention generally relates to a semiconductor device and particularly relates to a manufacturing method of a semiconductor device that is packaged with a fine-structured interposer that is fabricated using a silicon substrate.

2. Description of the Related Art

In a semiconductor device of the above-described type, semiconductor chips are mounted on an interposer. Accordingly, along with recent developments in semiconductor chips having finer and thinner structures, efforts are being made to provide interposers (wiring substrates or rearranging substrates) having finer and thinner structures. Interposers are normally made by forming a stack of insulating layers and conductive layers that serve as interconnections.

Recently, it has been proposed to fabricate interposers using a fine-machining technique such as a photolithography technique used in a semiconductor Chip manufacturing device. Generally, in such an interposer manufacturing process using a photolithography technique, interconnection patterns and insulating layers are stacked on one side of a silicon substrate and lands of external connection mounting terminals are formed on the other side of the silicon substrate. The lands and the interconnection patterns which are on opposite sides of the silicon substrate are electrically connected by vias formed through the silicon substrate.

By using a silicon substrate, wiring patterns patterns and insulating layers of an interposer can be formed in a manner similar to a process of manufacturing a semiconductor chip. Therefore, there is an advantage that a fine- and multilayer-structured interposer can be formed.

According to the above-mentioned interposer manufacturing method using a silicon wafer, it is necessary to perform the steps of forming through-holes in the silicon substrate for providing vias connecting front and sides the interposer, give an insulation treatment in which SiO2 layers are formed on inner surfaces of the through-holes and filling the through-holes with plating layers. The silicon substrate has a certain thickness for sustaining sufficient strength during the interposer manufacturing process. Therefore, in order to form through-holes through such a silicon substrate and to give insulation and plating treatments on the inner surfaces of the through-holes, expensive devices are used with increased machining time. This results in an increase of manufacturing cost for interposers.

The silicon substrate itself is provided for sustaining the strength and is not necessary for the function of the interposer. However, since the thickness of the silicon substrate itself is greater than the thicknesses of the wiring patterns and the insulation layers, an overall thickness of the interposer becomes comparatively great due to the thickness of the silicon substrate.

Further, in a process step of filling the plating layers in the through-holes, it is technically difficult to prevent voids in the plating layer that may lead to lower conductivity and reduced reliability.

Further, since the silicon substrate is very thin, it is difficult to handle the interposer as a single body during a manufacturing process.

Also, there is a problem with the semiconductor device in which the silicon substrate is provided with an interposer attached on one side and an insulating layer attached on the other side in that the interposer itself might warp. In such a case, it is difficult to mount LSI chips having fine-pitched electrodes onto the interposer.

SUMMARY OF THE INVENTION

Accordingly, it is a general object of the present invention to provide a method of manufacturing semiconductor devices that can obviate the problems described above.

It is another and more specific object of the present invention to provide a method of manufacturing a semiconductor device with an interposer wherefrom a silicon substrate for sustaining the strength during manufacture is removed.

In order to achieve the above objects, the present invention provides a method of manufacturing a semiconductor device using a wiring substrate, which includes the steps of:

a) forming a peelable resin layer on a silicon substrate, the peelable resin layer having a lower adhesiveness to the silicon substrate and being easily peelable from the silicon substrate;

b) forming the wiring substrate on the peelable resin layer;

c) mounting a plurality of semiconductor chips on the wiring substrate;

d) forming semiconductor devices by sealing the plurality of semiconductor chips by a sealing resin;

e) individualizing the semiconductor devices by dicing the semiconductor devices from the sealing resin side but leaving the silicon substrate;

f) peeling each of the individualized semiconductor devices from the silicon substrate such that the silicon substrate and the peelable resin layer are separated; and g) exposing terminals provided on the wiring substrate by forming openings through the peelable resin layer or by removing the peelable resin layer.

According to the invention described above, the silicon substrate can be easily peeled off from the semiconductor devices by providing the peeling resin layer. Therefore, it is no longer necessary to perform a step of exposing terminals of the wiring board by processing the silicon wafer. Also, the thickness of the semiconductor device can be reduced by a thickness of the silicon substrate to be removed.

The present invention further provides a method of manufacturing the semiconductor device using a wiring substrate, which includes the steps of:

a) forming a peelable resin layer on a silicon substrate, the peelable resin layer having a lower adhesiveness to a wiring substrate and being easily peelable from a wiring substrate;

b) forming the wiring substrate on the peelable resin layer;

c) mounting a plurality of semiconductor chips on the wiring substrate;

d) forming semiconductor devices by sealing the plurality of semiconductor chips by a sealing resin;

e) individualizing the semiconductor devices by dicing the semiconductor devices from the sealing resin side but leaving the silicon substrate; and f) peeling each of the individualized semiconductor devices from the silicon substrate such that the silicon substrate and the peelable resin layer are separated.

According to the invention described above, the silicon substrate and the peelable resin can be easily peeled off from the semiconductor devices by providing the peeling resin layer. Therefore, it is no longer necessary to perform a step of exposing terminals of the wiring board by processing the silicon wafer. Also, the thickness of the semiconductor device can be reduced by a thickness of the silicon substrate to be removed. Also, the peelable resin layer may be removed.

The present invention further provides a method of manufacturing the semiconductor device using a wiring substrate, including the steps of:

a) forming a peelable resin layer on a silicon substrate, the peelable resin layer having a lower adhesiveness to the silicon substrate and being easily peelable from the silicon substrate;

b) forming the wiring substrate on the peelable resin layer;

c) mounting a plurality of semiconductor chips on the wiring substrate;

d) forming semiconductor devices by sealing the plurality of semiconductor chips by a sealing resin;

e) thinning the silicon substrate by a grinding process;

f) peeling the semiconductor devices from the silicon substrate with the peelable resin layer being attached to the thinned silicon substrate such that the silicon substrate and the peelable resin layer are separated;

g) individualizing the semiconductor devices by dicing the semiconductor devices; and h) exposing terminals provided on the wiring substrate by forming openings through the peelable resin layer or by removing the peelable resin layer.

According to the invention described above, the silicon substrate becomes flexible by thinning the silicon substrate, and as a result of a synergy effect with the low-adhesiveness of the peelable resin layer, the silicon substrate can be easily peeled off from the semiconductor device. Therefore, it is no longer necessary to perform a step of exposing terminals of the wiring board by processing the silicon wafer. Also, the thickness of the semiconductor device can be reduced by a thickness of the silicon substrate to be removed.

The present invention further provides a method of manufacturing the semiconductor device using a wiring substrate, including the steps of:

a) forming a peelable resin layer on a silicon substrate, the peelable resin layer having a lower adhesiveness to a wiring substrate and being easily peelable from a wiring substrate;

b) forming the wiring substrate on the peelable resin layer;

c) mounting a plurality of semiconductor chips on the wiring substrate;

d) forming semiconductor devices by sealing the plurality of semiconductor chips by a sealing resin;

e) thinning the silicon substrate by a grinding process;

f) peeling the semiconductor devices from the silicon substrate with the peelable resin layer being attached to the thinned silicon substrate such that the silicon substrate and the peelable resin layer are separated; and g) individualizing the semiconductor devices by dicing the semiconductor devices.

According to the invention described above, the silicon substrate becomes flexible by thinning the silicon substrate, and as a result of a synergy effect with the low-adhesiveness of the peelable resin layer, the silicon substrate can be easily peeled off from the semiconductor device. Therefore, it is no longer necessary to perform a step of exposing terminals of the wiring board by processing the silicon wafer. Also, the thickness of the semiconductor device can be reduced by a thickness of the silicon substrate to be removed.

The present invention further provides a method of manufacturing the semiconductor device using a wiring substrate, including the steps of:

a) forming a peelable resin layer on a silicon substrate, the peelable resin layer having a lower adhesiveness to the silicon substrate and being easily peelable from the silicon substrate;

b) forming the wiring substrate on the peelable resin layer;

c) mounting a plurality of semiconductor chips on the wiring substrate;

d) forming semiconductor devices by filling insulating resin between the plurality of semiconductor chips and the wiring substrate;

e) adhering a frame-like member on the silicon substrate such that the frame-like member surrounds each of the plurality of semiconductor chips, the frame-like member being made of a material having a higher rigidity than that of the wiring substrate;

f) individualizing the semiconductor devices by dicing the semiconductor devices from the frame-like member side but leaving the silicon substrate;

g) peeling each of the individualized semiconductor devices from the silicon substrate such that the silicon substrate and the peelable resin layer are separated; and h) exposing terminals provided on the wiring substrate by forming openings through the peelable resin layer or by removing the peelable resin layer.

According to the invention described above, the semiconductor device can be maintained substantially flat by the rigidity of the frame-like member and therefore deformation of the semiconductor chip can be prevented.

The present invention further provides a method of manufacturing the semiconductor device using a wiring substrate, including the steps of:

a) forming a peelable resin layer on a silicon substrate, the peelable resin layer having a lower adhesiveness to a wiring substrate and being easily peelable from a wiring substrate;

b) forming the wiring substrate on the peelable resin layer;

c) mounting a plurality of semiconductor chips on the wiring substrate;

d) forming semiconductor devices by filling insulating resin between the plurality of semiconductor chips and the wiring substrate;

e) adhering a frame-like member on the silicon substrate such that the frame-like member surrounds each of the plurality of semiconductor chips, the frame-like member being made of a material having a higher-rigidity than that of the wiring substrate;

f) thinning the silicon substrate by a grinding process;

g) peeling the semiconductor devices with the peelable resin layer being attached to the thinned silicon substrate such that the wiring substrate and the peelable resin layer are separated; and g) individualizing the semiconductor devices by dicing the semiconductor devices.

According to the invention described above, the semiconductor device can be maintained substantially flat by the rigidity of the frame-like member and therefore deformation of the semiconductor chip can be prevented.

The present invention further provides a semiconductor device including:

a thin-film multilayer substrate;

at least one semiconductor chip mounted on the thin-film multilayer substrate;

a package substrate whereto the thin-film multilayer substrate is connected; and external connection terminals provided on the package substrate, wherein the thin-film multilayer substrate is fixed to the package substrate.

According to the invention described above, the thin-film multilayer substrate itself is fixed on the package substrate by material such as solder, and therefore, a silicon substrate for sustaining the strength of the thin-film multilayer substrate can be dispensed with. Accordingly, the height (thickness) of the semiconductor device can be reduced. Also, there is no need to provide conductive parts that penetrate through the silicon substrate and therefore any defect originating from the conductive parts can be prevented and the manufacturing cost can be reduced.

The present invention further provides a method of manufacturing the semiconductor device, including the steps of:

a) forming a metal thin-film layer on a silicon substrate;

b) forming a thin-film multilayer substrate by forming conductive layers and insulating layers in multiple levels on the metal thin-film layer;

c) attaching a supporting member on the thin-film multilayer substrate by means of an adhesive member;

d) removing the silicon substrate and the metal thin-film layer;

e) individualizing the thin-film multilayer substrate together with the supporting member;

f) mounting the thin-film multilayer substrate on a package substrate and fixing the thin-film multilayer substrate on the package substrate;

g) reducing adhesiveness of the adhesive member and peeling the supporting member and the adhesive member from the thin-film multilayer substrate; and h) mounting semiconductor chips on the thin-film multilayer substrate.

According to the invention described above, even if the silicon substrate is removed, the thin-film multilayer substrate is held in a flat state and therefore easy handling can be achieved without deforming the thin-film multilayer substrate.

The present invention further provides a semiconductor device including:

a thin-film multilayer substrate;

at least one semiconductor chip mounted on the thin-film multilayer substrate;

a package substrate whereto the thin-film multilayer substrate is connected; and external connection terminal provided on the package substrate, wherein the semiconductor chip is sealed on the thin-film multilayer substrate by means of a sealing resin such that the back surface of the semiconductor chip is exposed from the sealing resin, and the thin-film multilayer substrate is fixed to the package substrate.

According to the invention described above, since the thin-film multilayer substrate is held in a flat state with the semiconductor chips mounted thereon and by the sealing resin, the silicon substrate that is provided for sustaining rigidity during the manufacturing process can be dispensed with. Thus, the height (thickness) of the semiconductor device can be reduced. Also, there is no need to provide conductive parts that penetrate through the silicon substrate. Therefore, defects related to the conductive parts can be prevented and thus the manufacturing cost can be reduced.

The present invention further provides a method of manufacturing the semiconductor device, including the steps of:

a) forming a metal thin-film layer on a silicon substrate;

b) forming a thin-film multilayer substrate by forming conductive layers and insulating layers in multiple levels on the metal thin-film layer;

c) mounting at least one semiconductor chip on the thin-film multilayer substrate;

d) resin sealing the semiconductor chip on the thin-film multilayer substrate;

e) removing the silicon substrate and the metal thin-film layer;

f) individualizing the thin-film multilayer substrate; and g) mounting the individualized thin-film multilayer substrate on a package substrate and fixing the thin-film multilayer substrate on the package substrate.

According to the invention described above, even if the silicon substrate is removed in the manufacturing process, the thin-film multilayer substrate can be held in a flat state by the semiconductor chips and the sealing resin. Thus, easy handling of the thin-film multilayer substrate can be achieved.

BRIEF DESCRIPTION OF THE DRAWINGS

FIGS. 14A through 14G are diagrams showing various steps of a semiconductor device manufacturing method using an interposer according to a third embodiment of the present invention.

DETAILED DESCRIPTION OF THE PREFERRED EMBODIMENTS

In the following, principle's and embodiments of the present invention will be described with reference to the accompanying drawings.

According to the present invention, an interposer with a simplified structure and reduced thickness can be obtained by an interposer manufacturing method in which a stacked structure of wiring layers and insulating layers is formed on a substrate for sustaining strength and then the substrate is removed by peeling it off from the stacked structure.

First, a manufacturing process of an interposer according to a first embodiment of the present invention will be described. FIGS. 1A through 2C are diagrams showing some of the manufacturing steps of the manufacturing process of an interposer according to the first embodiment of the present invention. A complete manufacturing process of an interposer is achieved by combining the process steps illustrated in FIGS. 1A through 2C.

Figure 1A:
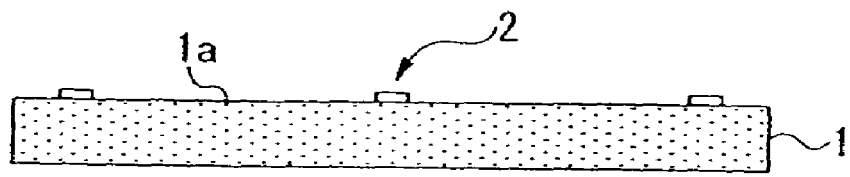
FIGS. 1A through 1F are diagrams showing several steps of an interposer manufacturing method according to a first embodiment of the present invention.
Figure 3:
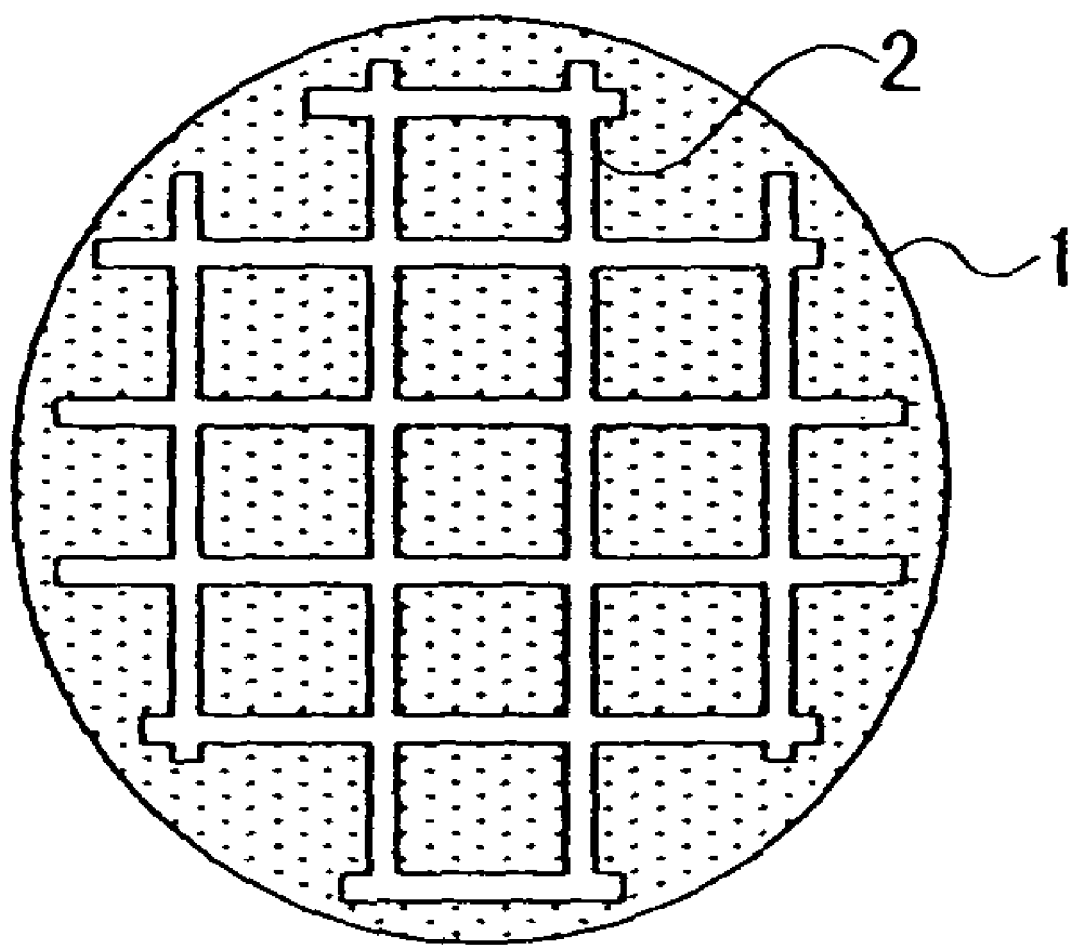
FIG. 3 is a plan view of a silicon wafer in which an adhesion protection resin layer shown in FIG. 1 is formed.

First, a silicon wafer 1 is prepared as a substrate, and as shown in FIG. 1A, a resin layer 2 for adhesion is formed on a surface 1a of the silicon wafer 1. The resin layer 2 is does not cover the entire surface 1a of the silicon wafer 1 but is formed in a shape of a grid as shown in FIG. 3. The grid-like resin layer 2 may be formed by applying resin by a spin-coating process on the entire surface 1a of the silicon wafer 1. The configuration of the grid of the resin layer 2 corresponds to dicing lines for a later dicing step.

The silicon wafer has a thickness of, for example, 500 μm to 700 μm and serves as a member that sustains the strength of the interposer during the manufacturing process. For manufacturing a conventional semiconductor device, the silicon wafer is ground to a thickness of about 100 μm to 200 μm before forming through-holes. The resin layer 2 may be formed of polyimide resin that is normally used in fabricating a semiconductor chip and has a good adhesiveness to the silicon wafer 1.

Figure 1B:
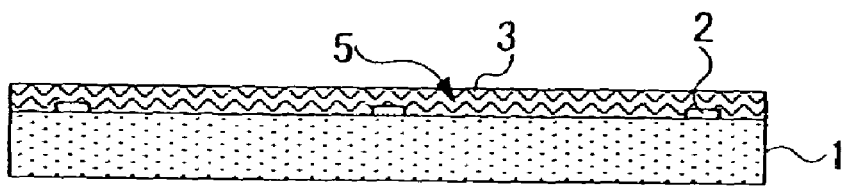

Then, as shown in FIG. 1B, a peelable resin layer 3 having lower adhesiveness is formed to cover the entire surface 1a of the silicon wafer 1. The low-adhesiveness peelable resin layer 3 may be formed of polyimide resin that is of a type that has a lower adhesiveness to the silicon wafer 1 as compared to the polyimide resin of the above-mentioned resin layer 2 and can be easily peeled from the silicon wafer. The low-adhesiveness resin layer 3 has a thickness greater than the resin layer 2 and is formed to cover the resin layer 2.

Figure 1C:
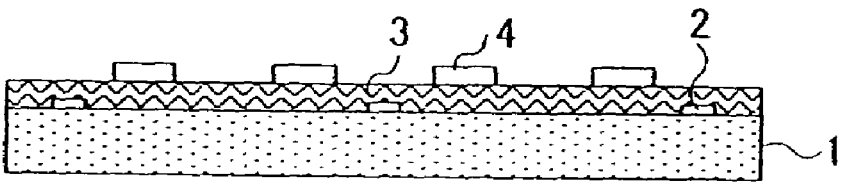
Figure 1D:
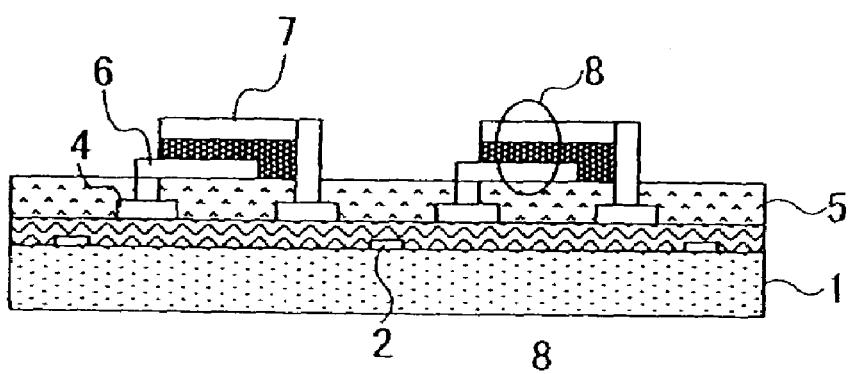

Then, as shown in FIG. 1C, lands 4 are formed by Cu plating on the resin layer 3. Then, as shown in FIG. 1D, the lands 4 are covered with an insulating layer 5 and capacitors 8 are formed using neighboring lands 4. In detail, a first conductive layer pattern 6 serving as an electrode is formed on one of the pair of lands 4 and a second conductive layer pattern 7 is formed above the first conductive layer 6 spaced apart at a certain interval. The second conductive pattern 7 is connected to the other one of the pair of lands 4. A material with a high dielectric constant is filled between the first conductive layer pattern 6 and the second conductive layer pattern 7, so as to form a capacitor 8 between the first conductive layer pattern 6 and the second conductive layer pattern 7. The pair of lands 4 serve as terminals of the capacitor 8.

Figure 1E:
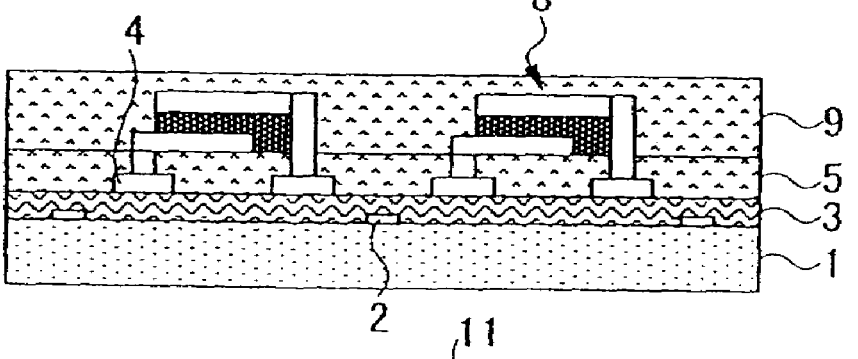
Figure 1F:
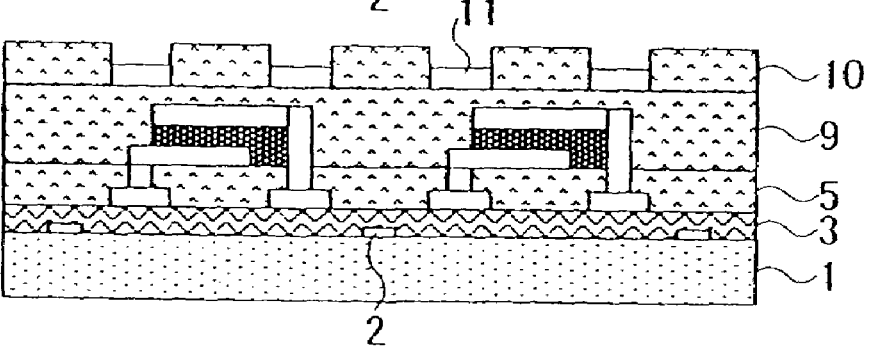

Then, as shown in FIG. 1E, the capacitor is embedded in an insulating layer 9. Then, as shown in FIG. 1F, a further insulating layer 10 is formed on the insulating layer 9. The further insulating layer 10 is removed in a predetermined pattern and lands 11 are formed at the removed portions by Cu plating, for example.

Figure 2A:
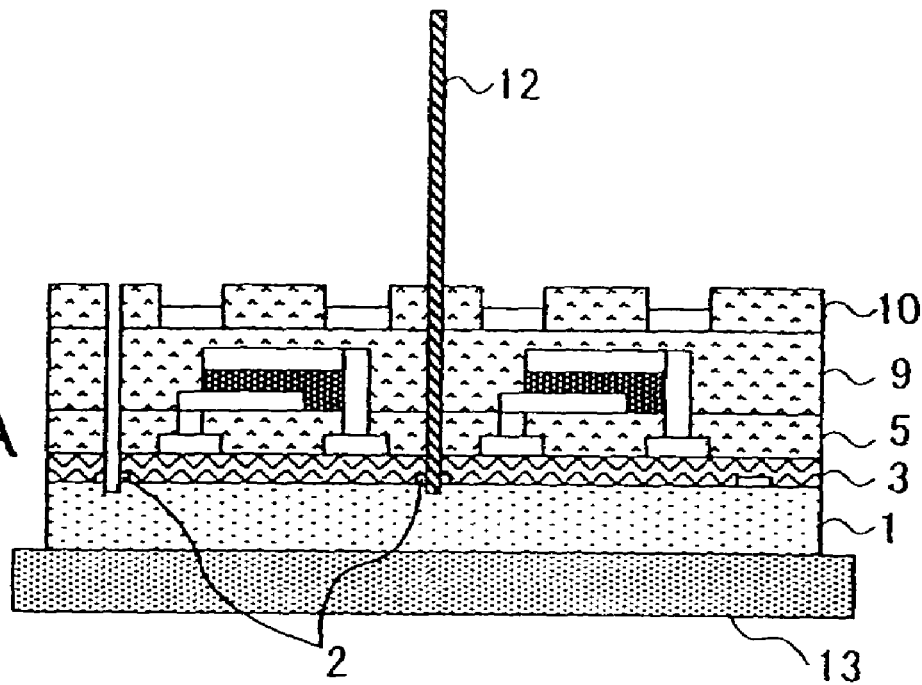
FIGS. 2A through 2C are diagrams showing several steps of an interposer manufacturing method according to the first embodiment of the present invention.

Then, as shown in FIG. 2A, a stacked structure (interposer) with internally formed capacitors 8 is individualized using a dicing blade. In detail, the back surface 1b of the silicon wafer is attached to a dicing tape 13 and the dicing blade 12 is moved along dicing lines to cut the stacked structure. The cut-in depth of the dicing blade 12 is such that the resin layer 2 is cut and the tip (or the peripheral edge) of the dicing blade 12 slightly cuts into the silicon wafer 1 which is a substrate. Therefore, a major part of the resin layer 2 is cut and removed as a result of a dicing process.

It is noted that the resin layer 2 has a good adhesiveness to the silicon wafer 1 and also has a good adhesiveness to the resin layer 3 which is also made of the polyimide resin of the same type. Therefore, even if the resin layer 3 having a lower adhesiveness to the silicon wafer 1 is used, a certain adhesiveness can be obtained for the silicon wafer 1 via the resin layer 2. Therefore, in the manufacturing steps of an interposer (steps shown in FIGS. 1A-1F), the stacked structure can be formed on the silicon wafer 1 by using the silicon wafer 1 as a strength-sustaining member.

Figure 2B:
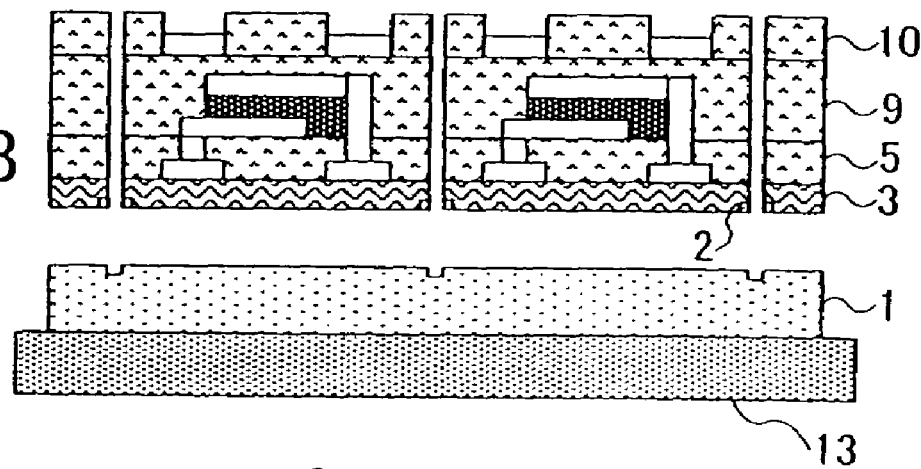

Referring to FIG. 2A, it can be seen that a major part of the resin layer 2 is removed after the individualizing step by the dicing blade 12. Therefore, adhesiveness between the stacked structure and the silicon wafer 1 is reduced and the individualized stacked structure (corresponds to an interposer) can be easily peeled off from the silicon wafer 1 as shown in FIG. 2B.

Figure 2C:
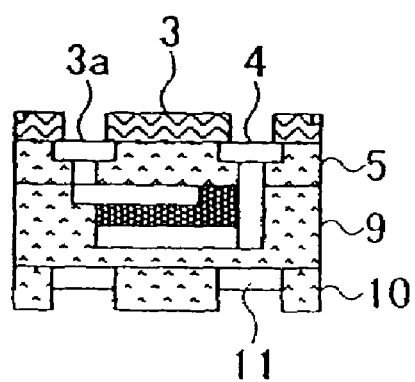

As shown in FIG. 2C, each stacked structure that has been peeled off from the silicon wafer 1 is provided with openings 3a at positions corresponding to the lands 4 of the resin layer 3 such that the lands are exposed in the openings 3a. The openings 3a may be formed by a laser machining process.

As a result of the steps described above, an interposer with the capacitor 8 embedded inside is obtained. As has been described above, according to the present embodiment, an interposer with a reduced thickness can be provided by forming a stacked structure of an interposer via the low-adhesiveness polyimide resin layer 3 on the silicon wafer 1 serving as a substrate and then removing the silicon wafer 1 by peeling it off. The resin layer 2 is used for securely fixing the low-adhesiveness polyimide resin layer 3 on the silicon wafer 1, only during the manufacturing steps.

According to the embodiment described above, the capacitor 8 is formed inside the interposer, however, it is not necessary to form a capacitor inside the interposer and the interposer may be simply for redistribution connections. Also, according to the present embodiment, a silicon wafer is used as a substrate and the low-adhesiveness resin layer 3 is made of polyimide resin, however, the present invention is not limited to those materials and substrates and resin of other materials may also be used.

Now, an example of a series of steps will be described in which the interposer manufacturing steps described above and steps of mounting a semiconductor chip onto the interposer are combined.

FIGS. 4A through 4E are diagrams showing some steps of the above-mentioned series of steps. After forming the stacked structure on the silicon wafer 1 by performing the steps of FIGS. 1A-1F, the process proceeds to a step shown in FIG. 4A.

Figure 4A:
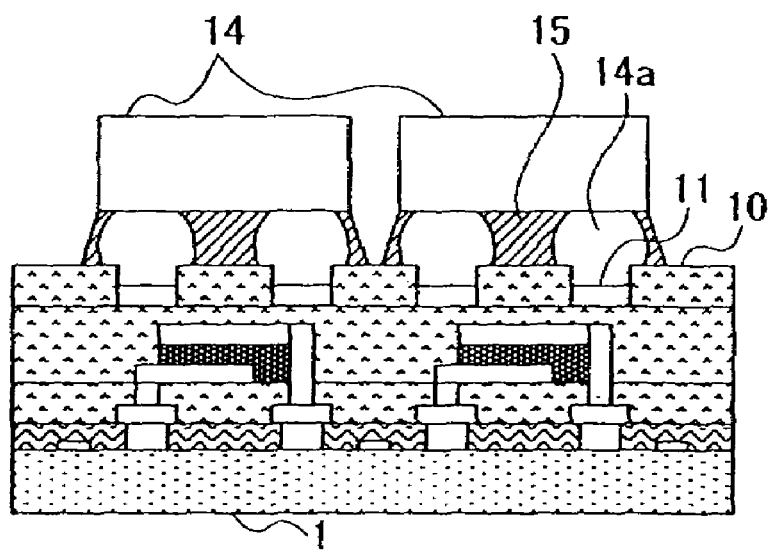
FIGS. 4A through 4E are diagrams showing various steps of a semiconductor device manufacturing method using an interposer according to the first embodiment of the present invention.

In the step shown in FIG. 4A, LSI chips 14 provided with external connection electrodes such as solder bumps are mounted on the interposer. In detail, solder bumps 14a of the LSI chips 14 are brought into contact with the exposed lands 11. Then, an underfill material 15 is filled between the LSI chips 14 and the insulating layer 10.

Figure 4B:
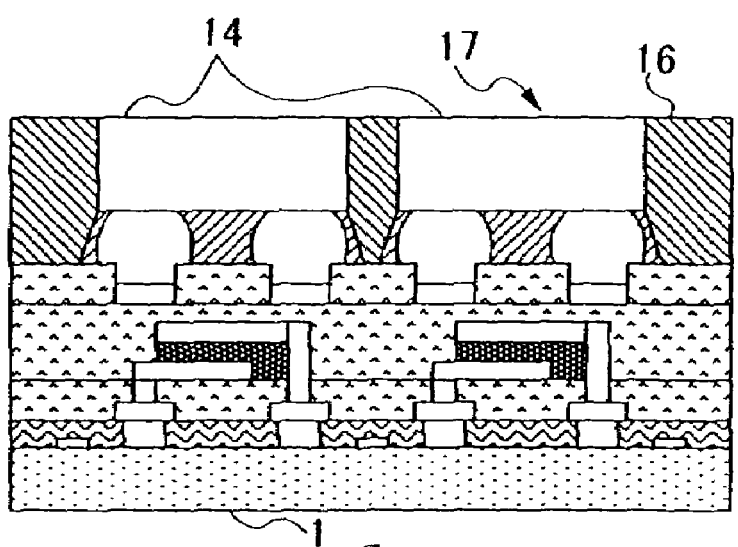
Figure 4C:
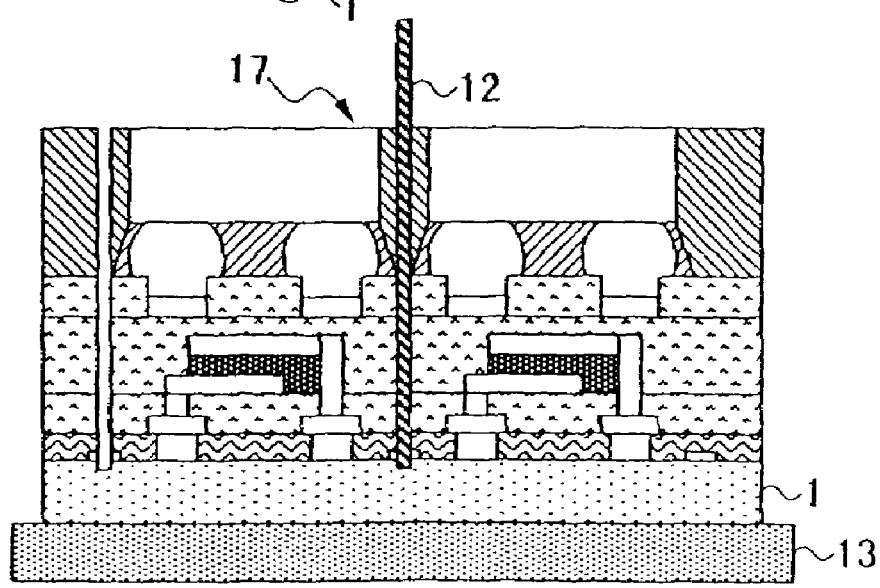

Then, as shown in FIG. 4B, the LSI chips 14 are sealed with sealing resin 16. Thus, a plurality of semiconductor devices 17 are formed on the silicon wafer 1. Then, as shown in FIG. 4C, the semiconductor devices 17 are individualized by a dicing process. This dicing process is carried out in a manner similar to the dicing process shown in FIG. 2A such that a major part of the resin layer 2 is removed and shallow cuts are made in the silicon wafer 1.

Figure 4D:
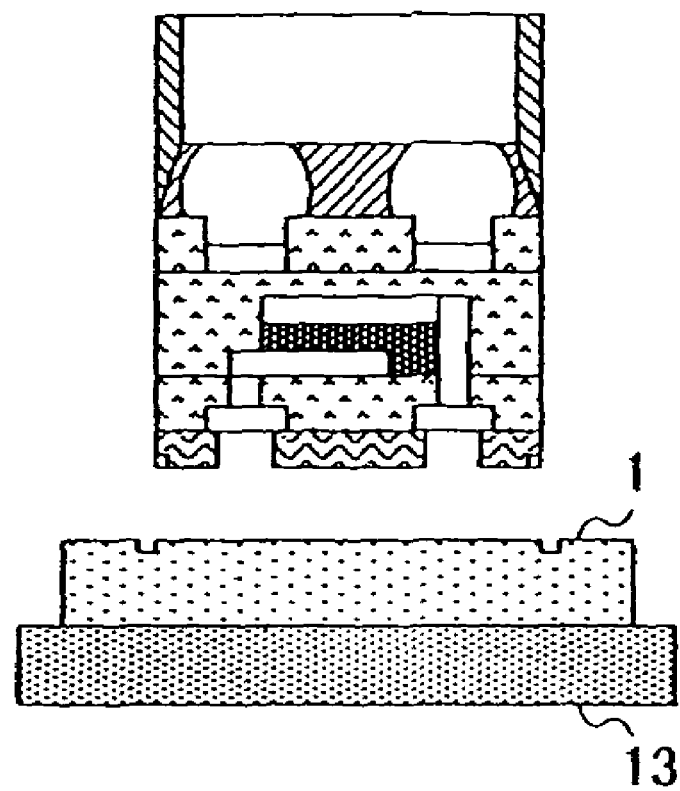
Figure 4E:
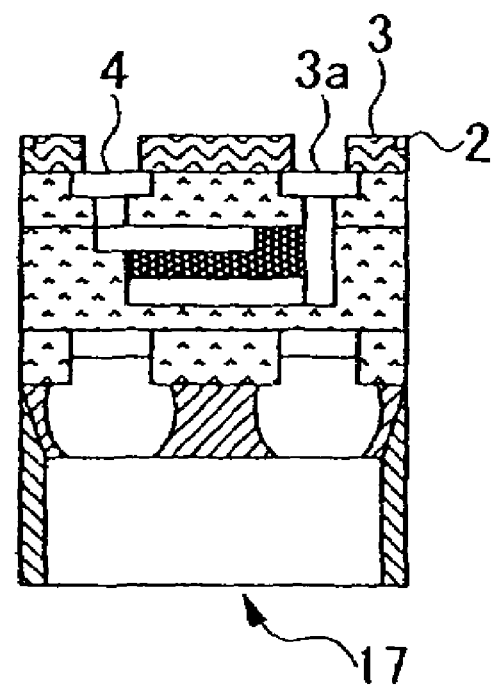

Then, as shown in FIG. 4D, the individualized semiconductor devices 17 are peeled off from the silicon wafer 1. Then, as shown in FIG. 4E, the openings 3a are formed through the resin layer 3 such that the lands 4 are exposed. The exposed lands 4 serves as external connection terminals of the semiconductor device 17.

Figure 5:
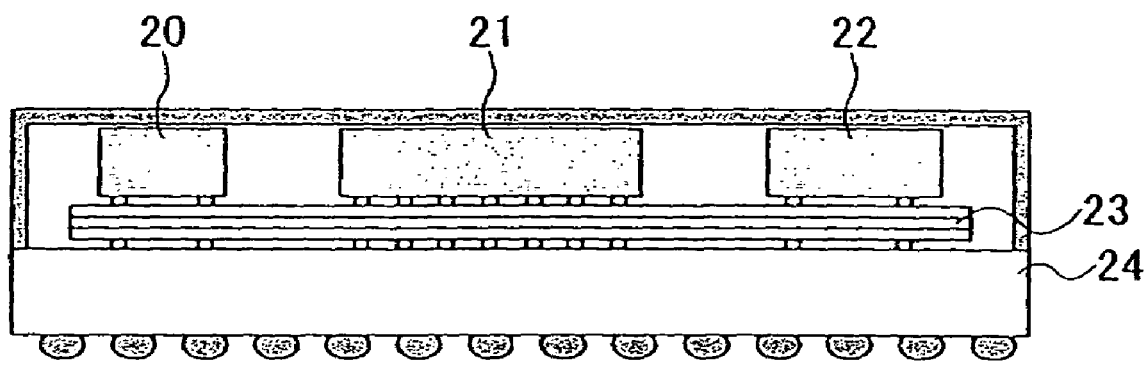
FIG. 5 is a diagram showing an example in which a plurality of LSI chips are mounted on the interposer according to the first embodiment of the present invention.

The above description relates to an example of a semiconductor device having a single LSI chip. However, it is also possible to mount a plurality of different types of LSI chips on an interposer. For example, as shown in FIG. 5, a possible application is to provide a semiconductor device by connecting a high-speed I/O interface chip 20, a logic LSI 21 and a RAM chip 22 by an interposer 23 manufactured in accordance with the above-mentioned steps and further arranging them on an LSI package 24.

Now, a method of manufacturing a semiconductor device using an interposer according to a second embodiment of the present invention will be described. FIGS. 6A through 6E are diagrams showing a semiconductor device manufacturing method using an interposer according to the second embodiment of the present invention.

An interposer 30 of the present embodiment is fabricated in a similar manner to the above-mentioned first embodiment. That is to say, a peelable resin layer 3 having lower adhesiveness to the silicon wafer 1 is formed and then a stacked structure of wiring layers and insulating layers are formed thereon. In the present embodiment, after forming the interposer 30 on the silicon wafer 1 via the resin layer 3, semiconductor chips 31 are mounted on the interposer 30 as shown in FIG. 6A (flip-chip mounting). In this state, a plurality of interposers 30 adhere to the silicon wafer 1 in a mutually connected manner. Therefore, the plurality of interposers 30 as a whole have a certain adhesive strength and thus do not peel off from the silicon wafer 1. In other words, the resin layer 3 is made of a material selected from materials having such an adhesive property.

Figure 6D:
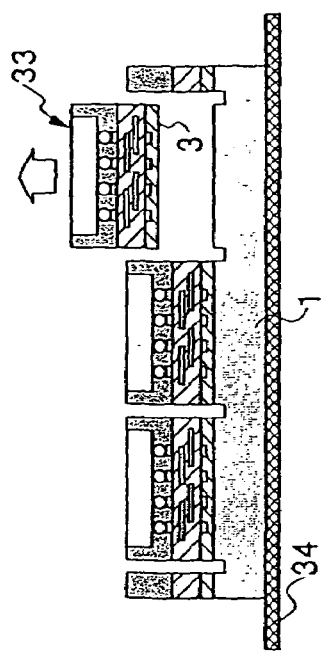
FIGS. 6A through 6E are diagrams showing various steps of the semiconductor device manufacturing method using an interposer according to a second embodiment of the present invention.
Figure 6E:
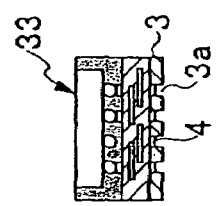
Figure 6A:
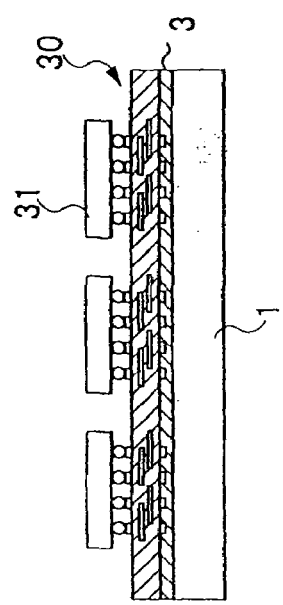
Figure 6B:
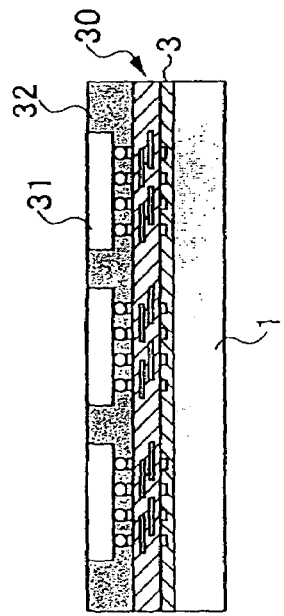
Figure 6C:
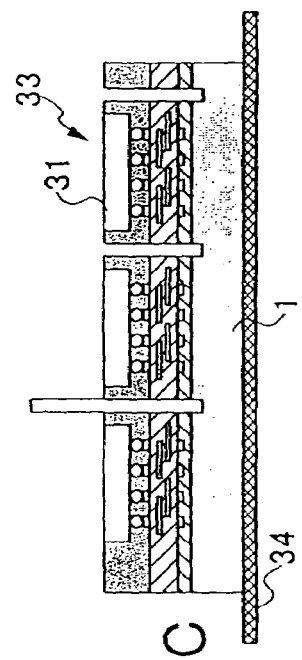

After mounting the semiconductor chips 31 on the interposer 30, the semiconductor chips 31 are sealed by sealing resin 32 as shown in FIG. 6B (wafer molding). Thereby, a plurality of semiconductor devices 33 are formed on the silicon wafer 1. Thereafter, as shown in FIG. 6C, a UV tape 34 is attached to the back surface of the silicon wafer 1 and an individualizing step of the semiconductor devices 33 is performed using the dicing blade 12 (Si half-cutting or dicing). The cuts made by the dicing blade 12 have a depth such that the dicing blade slightly goes into the silicon wafer 1 but the silicon wafer 1 is not separated by the cuts.

Then, as shown in FIG. 6D (Si half-cutting or dicing), the individualized semiconductor devices 33 are peeled off from the silicon wafer 1 by picking them up with a vacuum pickup apparatus (indicated by an arrow in FIG. 6D). Before the individualizing step, a plurality of semiconductor devices 33 are attached to the silicon wafer 1 by the resin layer 3 in a unified manner. However, since the resin layer 3 is also individualized by the individualizing step, the semiconductor devices 33 can be easily peeled off from the silicon wafer 1 that remains unindividualized (in one piece).

Finally, as shown in FIG. 6E, the openings 3a are formed through the resin layer 3, for example by a laser machining process so as to expose the lands 4 embedded in the resin layer 3. The lands 4 serve as external connection terminals of the semiconductor device 32. In the step show in FIG. 6E, the lands 4 are exposed by forming the openings 3a, but the lands 4 may be exposed by removing the resin layer 3 by any other technique such as dissolving the resin layer 3 with a solvent.

As has been described above, the semiconductor devices 33 fabricated using the interposers 30 formed on the silicon wafer 1 are securely adhered to the silicon wafer 1 until they are individualized. However, after the individualizing step, the semiconductor devices can be easily peeled off from the silicon wafer 1.

Figure 7:
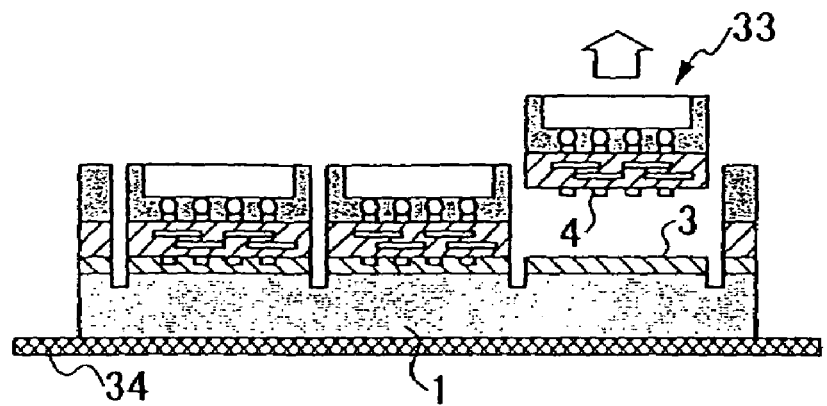
FIG. 7 is a diagram showing a step of separating a semiconductor device with the resin layer adhering to the silicon wafer.
Figure 8:
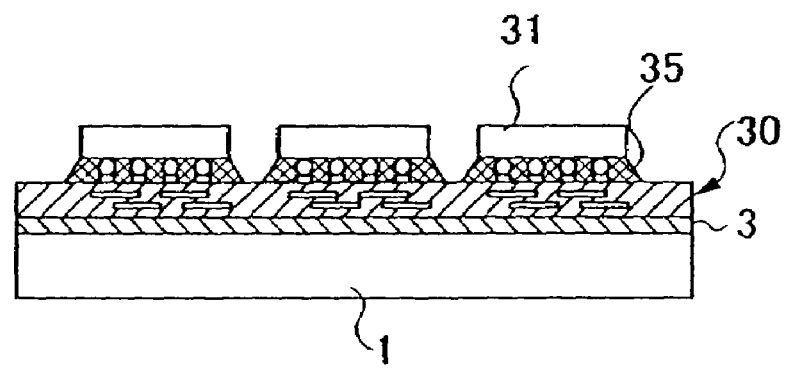
FIG. 8 is a diagram showing an example of filling an underfill material between the semiconductor chip and the interposer.

In the embodiment described above, instead of the resin having lower adhesiveness to the silicon wafer, the resin layer 3 may be made of a resin having lower adhesiveness to the interposer 30 (the lands 4 and the insulating layers) formed on the resin layer 3. Thereby, as shown in FIG. 7, the semiconductor device 1 including the interposer 30 can be separated with the resin layer 3 remaining adhered to the silicon wafer 1. In this case, the lands 4 can be exposed by performing a peeling process, and therefore, it is possible to eliminate the step shown in FIG. 6E in which the openings 3a are formed through the resin layer 3 for exposing the lands 4.

In the embodiment described above, the semiconductor chips 31 are sealed on the interposer 30 using a sealing resin. However, instead of the resin sealing, an underfill material 35 may be filled between the semiconductor chip 31 and the interposer 30 to form the semiconductor device 33.

Figure 9:
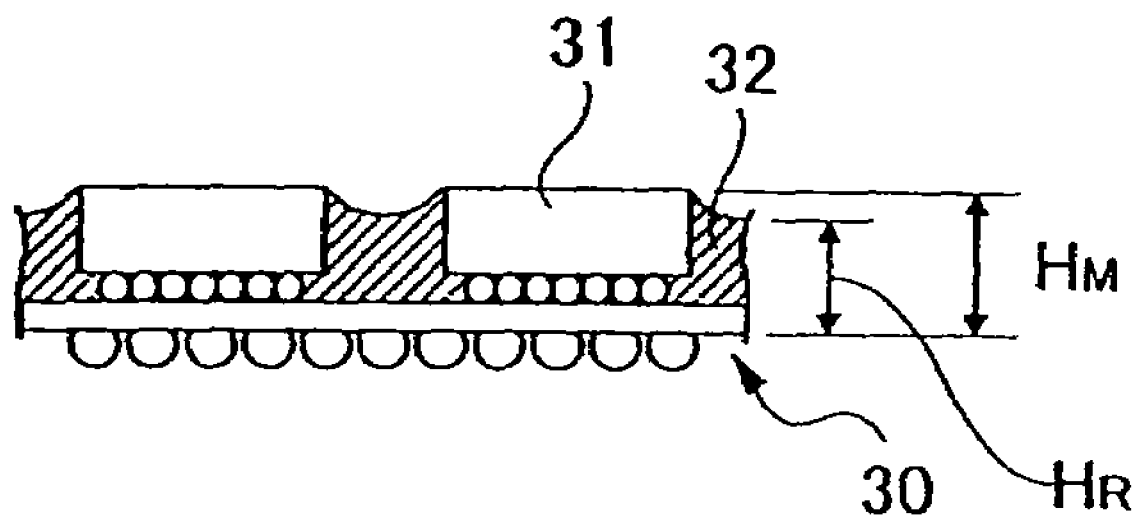
FIG. 9 is a diagram showing preferable dimensions of the sealing resin.

In the following, a further case in which the semiconductor chips 31 are sealed by the sealing resin 32 as shown in FIGS. 6B through 6E will be described. FIG. 9 is a diagram showing preferable dimensions of the sealing resin. As shown in FIG. 9, the height $H_R$ of the sealing resin that is filled between neighboring semiconductor chips 31 is preferably lower than the height (or level) $H_M$ of the back surface of the semiconductor chip 31 ($H_R < H_M$). The reason for this is as follows.

Since the interposer of the above embodiment is very thin and the semiconductor chips mounted thereon are also thin, the semiconductor devices are also thin and thus lack rigidity and may be easily deformed. Therefore, the interposer 30 may be deformed due to contraction caused by the curing of the sealing resin 32. That is, the interposer 30 may warp such that the warp occurs with the sealing resin 32 being on the inner side.

The deformation described above can be prevented by minimizing the amount of the sealing resin 32 provided around the semiconductor chips 31. In other words, the deformation of the semiconductor devices 33 can be reduced by lowering the level of the sealing resin 32.

FIGS. 10 through 13 are diagrams showing various steps of a process of molding resin such that the level of the sealing resin 32 is lowered as shown in FIG. 9. In general, the sealing resin 32 is filled between the semiconductor chips 31 by transfer molding.

Figure 10:
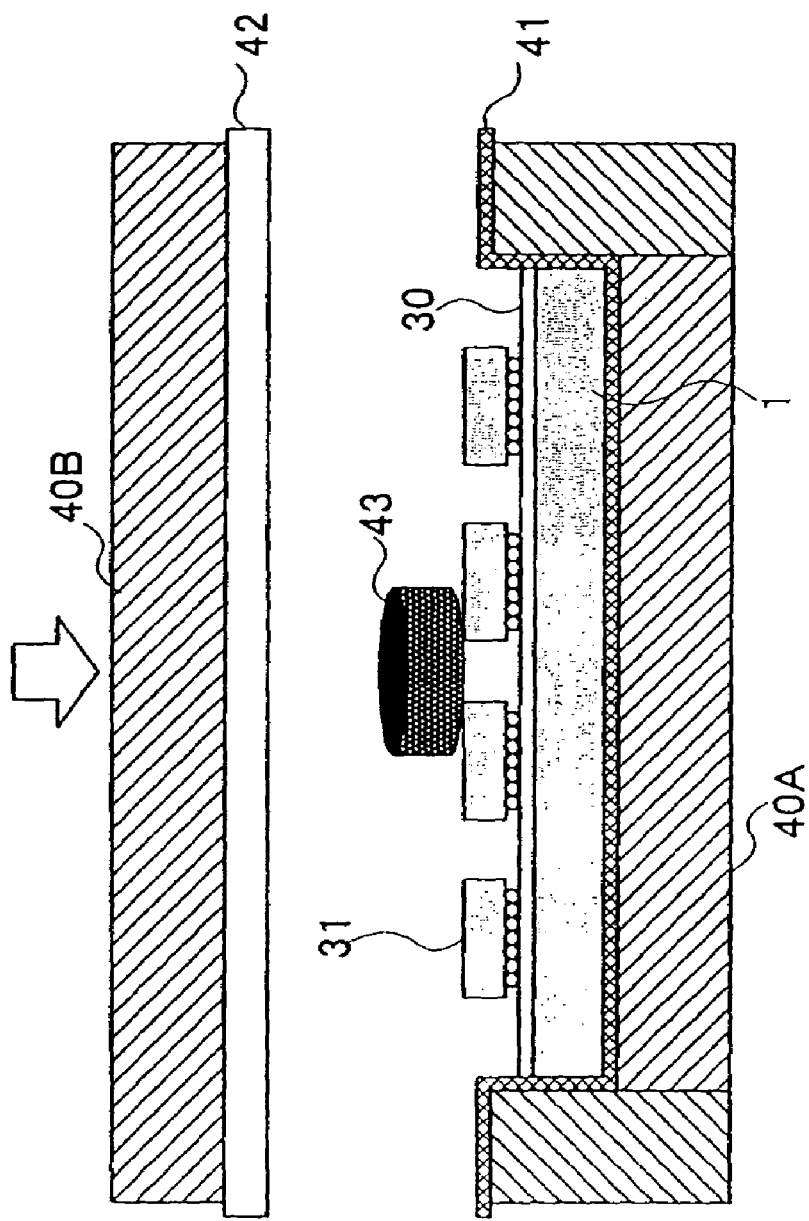
FIG. 10 is a diagram showing a first step of molding resin as shown in FIG. 9.

First, as shown in FIG. 10, a flexible film 41 is lined along the lower mold 40A that is used for transfer molding. The semiconductor chips 31 mounted on the silicon wafer 1 are arranged in the lower mold 40A. Then, a flexible film 42 is applied to an upper mold 40B. A tablet 43 of sealing resin is placed between the lower mold 40A and the upper mold 40B. The flexible film 42 applied to the upper mold 40B is an elastic film that has comparatively great thickness.

Figure 11:
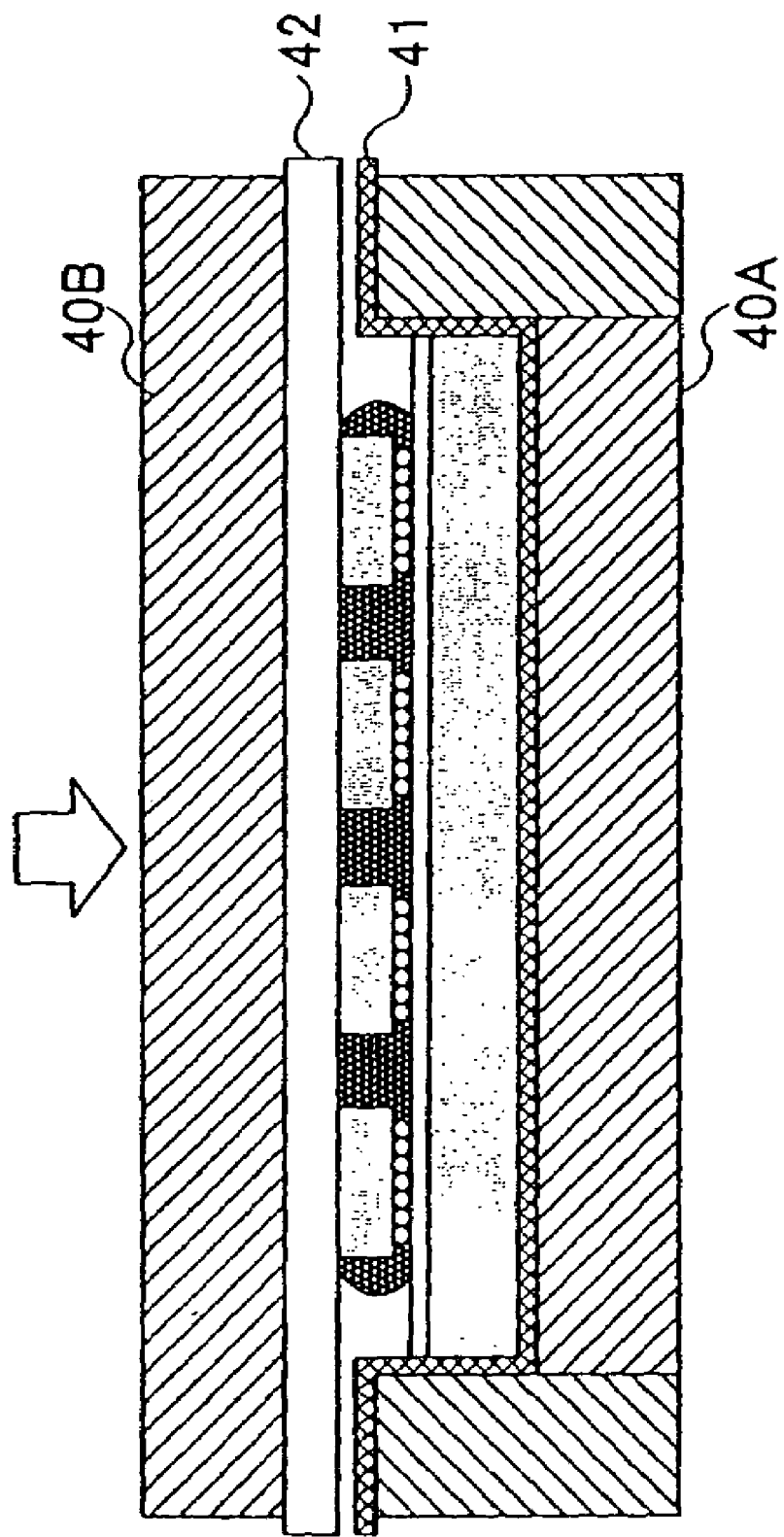
FIG. 11 is a diagram showing a second step of molding resin as shown in FIG. 9.

As shown in FIG. 11, as the lower mold 40A and the upper mold 40B are moved towards each other under a heated condition, the resin tablet 43 softens and is filled between the semiconductor devices 31. Then, the flexible film 42 of the upper mold 40B touches the back surfaces of the semiconductor chips 31.

Figure 12:
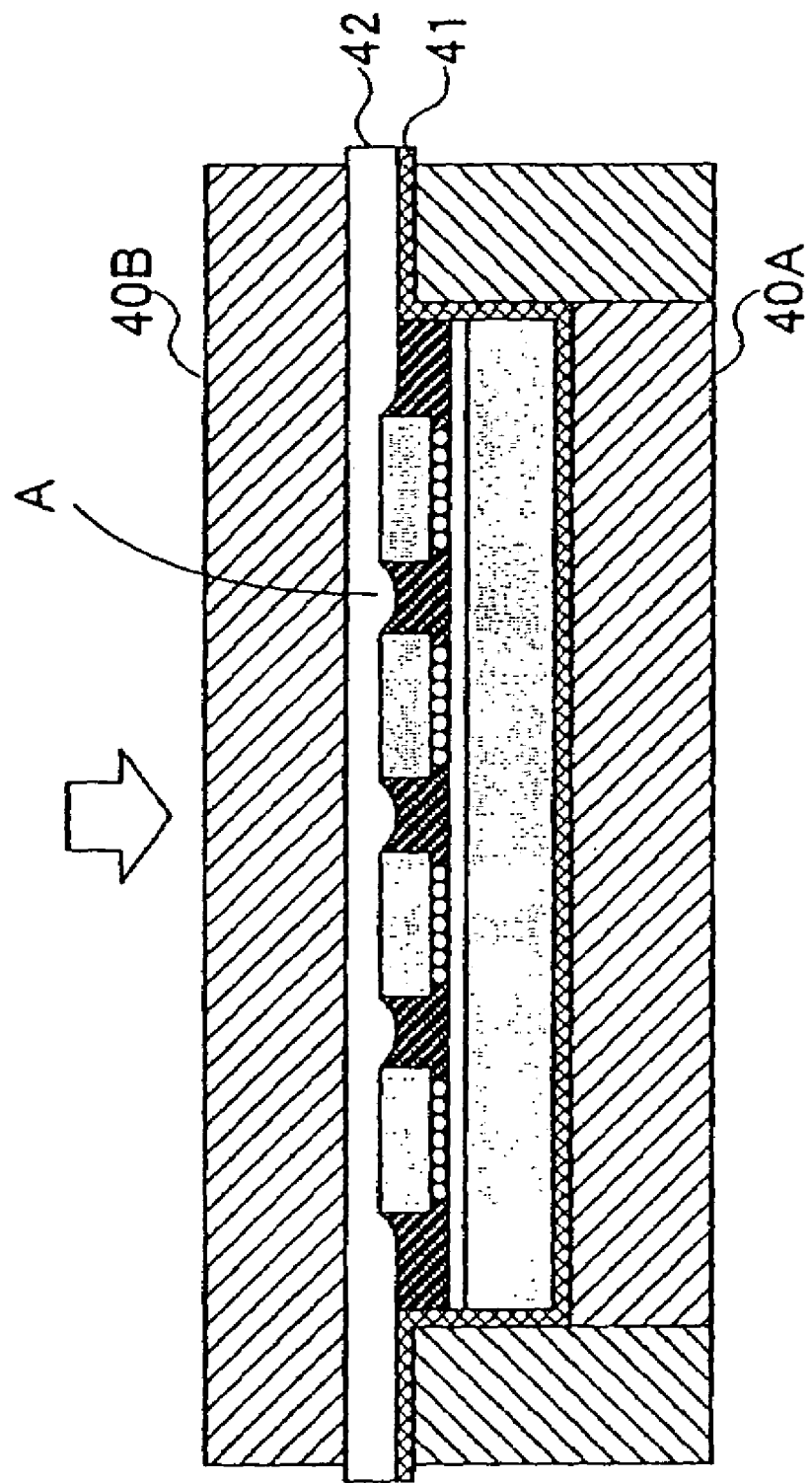
FIG. 12 is a diagram showing a third step of molding resin as shown in FIG. 9.
Figure 13:
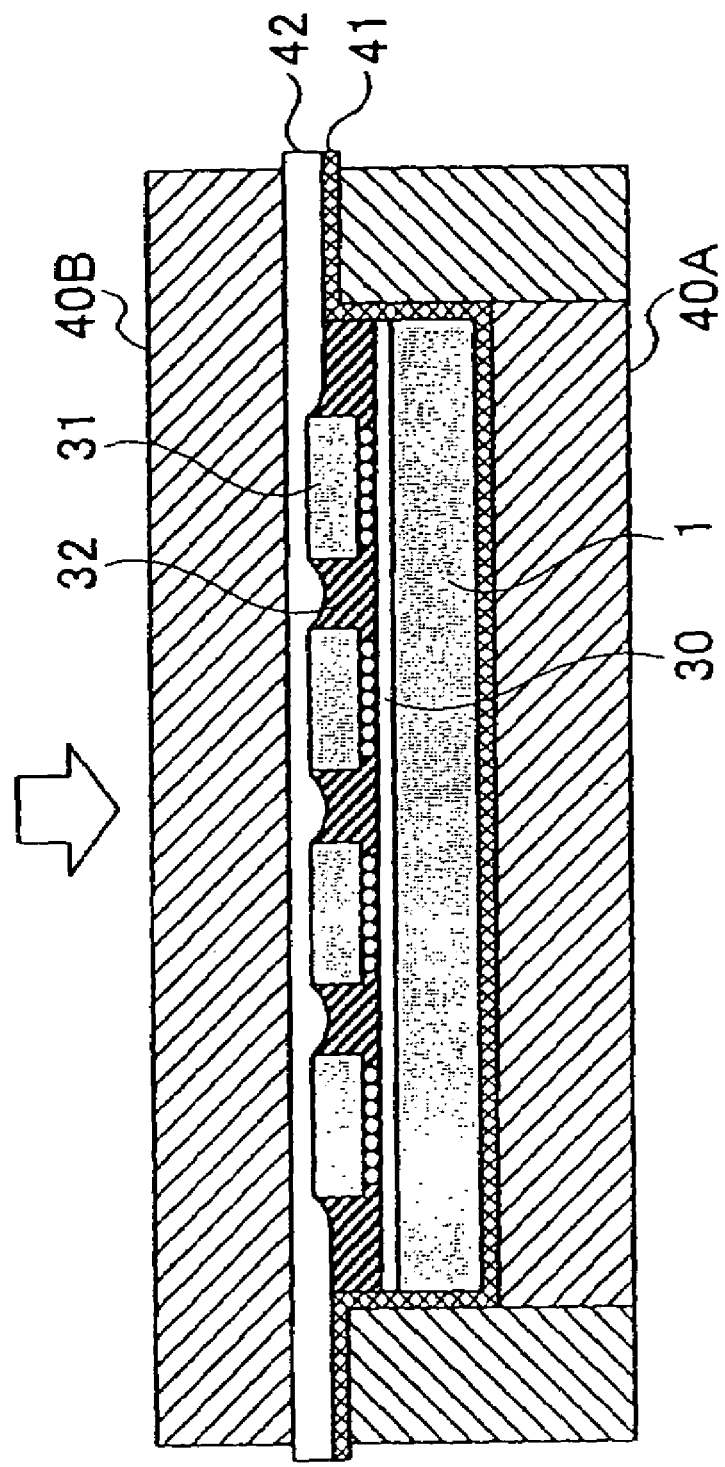
FIG. 13 is a diagram showing a fourth step of molding resin as shown in FIG. 9.

When the lower mold 40A and the upper mold 40B are further moved closer, as shown in FIG. 12, parts of the flexible film 42 that are in contact with the semiconductor chip 31 are compressed and deformed so that parts of the flexible film 42 between the semiconductor chips 31 become convex as shown by reference numeral A in the figure. Accordingly, the level of the sealing resin 32 between the semiconductor chips 31 becomes lower than the height of the semiconductor chips 31.

The sealing resin 32 is cured by reducing the temperature with the lower mold 40A and the upper mold 40B being completely closed. Thus, the semiconductor device is fabricated with the level of the sealing resin 32 being lower than the height of the semiconductor chip 31 as shown in FIG. 9.

The semiconductor devices formed on the silicon wafer 1 in a manner described above may be peeled off from the silicon wafer 1 in accordance with the peeling process shown in FIGS. 6A-6E or FIG. 7. The sealing resin provided around the semiconductor chips 31 of the semiconductor devices fabricated in such a manner has a reduced thickness and therefore deformation (or warping) due to contraction of the sealing resin can be reduced.

Now, a manufacturing process of a semiconductor device using an interposer of a third embodiment of the present invention will be described. FIGS. 14A through 14G are diagrams showing various steps of the semiconductor devices manufacturing method using the interposer of the third embodiment of the present invention.

FIGS. 14A and 14B show steps that are similar to the steps shown in FIGS. 6A and 6B (flip-chip mounting and wafer molding). In the present embodiment, after sealing the semiconductor chips 31 on the silicon wafer 1 with the sealing resin 32, the back surface of the silicon wafer 1 is ground as shown in FIG. 14C such that a silicon wafer with a thickness of 200 μm is reduced to a thickness of about 25 μm to 50 μm (silicon grinding).

Then, as shown in FIG. 14D, the thinned silicon wafer 1 is peeled off from the semiconductor devices (silicon peeling). As a result of the grinding process, silicon wafer 1 becomes a flexible foil, and therefore, the silicon wafer 1 can be easily peeled off. Then, as shown in FIG. 14E, the lands 4 are exposed by forming the openings 3a through the exposed resin layer 3 (hole forming).

Then, as shown in FIG. 14F, the semiconductor devices 33 are individualized with a UV tape 34 being attached to the semiconductor chip 34 side. Then, the semiconductor devices 33 are peeled off from the UV tape 34 to obtain completed semiconductor devices 33 (individualizing or dicing).

Figure 15A:
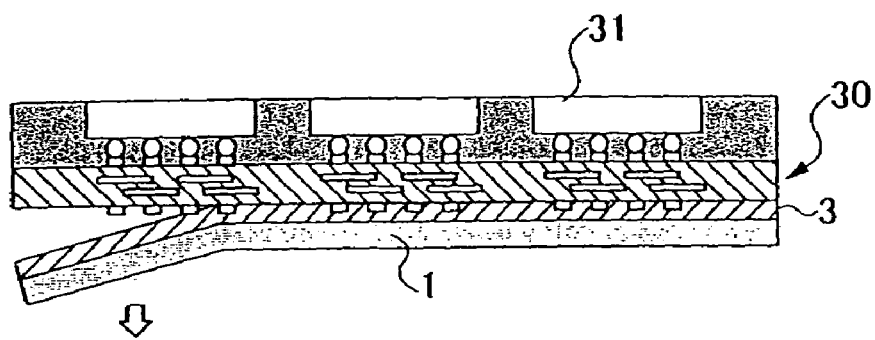
FIGS. 15A and 15B are diagrams showing steps of peeling the resin layer together with the silicon wafer.
Figure 15B:
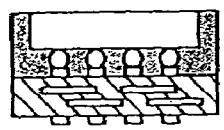

In the present embodiment, in a case where the resin layer 3 is made of a material that has greater adhesiveness to the interposer 30 than to the silicon wafer 1, it is also possible to peel off the resin layer 3 simultaneously with the peeling of the silicon wafer 1 as shown in FIG. 15A. Accordingly, only an individualizing step is required for completing the semiconductor device 33 shown in FIG. 15B, and a step of exposing the lands by forming the openings through the resin layer 3 can be omitted.

Now, a manufacturing process of a semiconductor device using an interposer of a fourth embodiment of the present invention will be described. FIGS. 16A through 16D are diagrams showing various steps of the semiconductor device manufacturing method using the interposer of the fourth embodiment of the present invention.

Figure 16A:
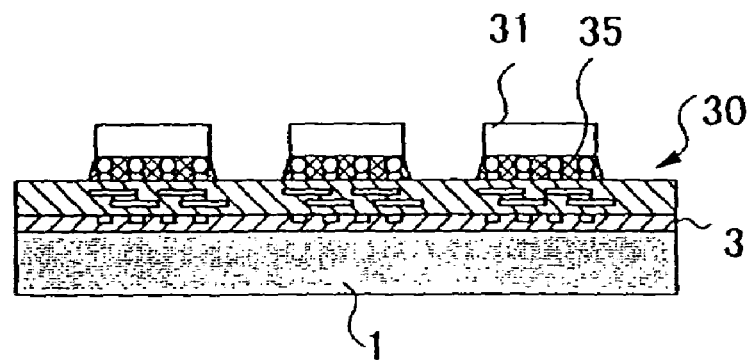
FIGS. 16A through 16D are diagrams showing various steps of a semiconductor device manufacturing method using an interposer according to a fourth embodiment of the present invention.
Figure 16B:
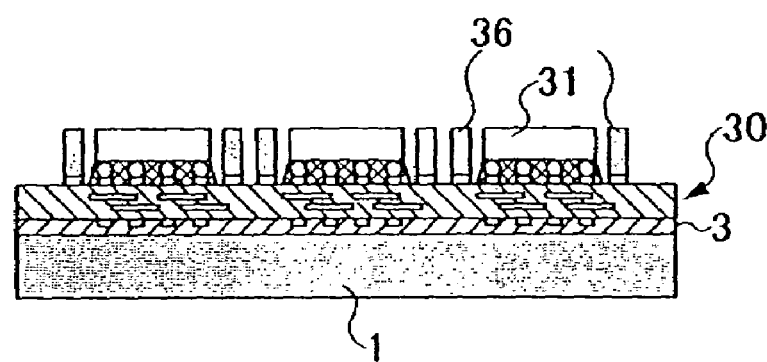

First, as shown in FIG. 16A, the semiconductor chips 31 are flip-chip mounted on the interposer 30 and the underfill material 35 is filled between the semiconductor chips 31 and the interposer 30 (flip-chip mounting and ulderfilling). Then, as shown in FIG. 16B, frames 36 made of material or resin are arranged and fixed on the interposer 30 by an adhesive agent such that each of the frames 36 surrounds the semiconductor chip 31 (frame forming). In this manner, the semiconductor chips 31 and their joining parts are protected.

Figure 16C:
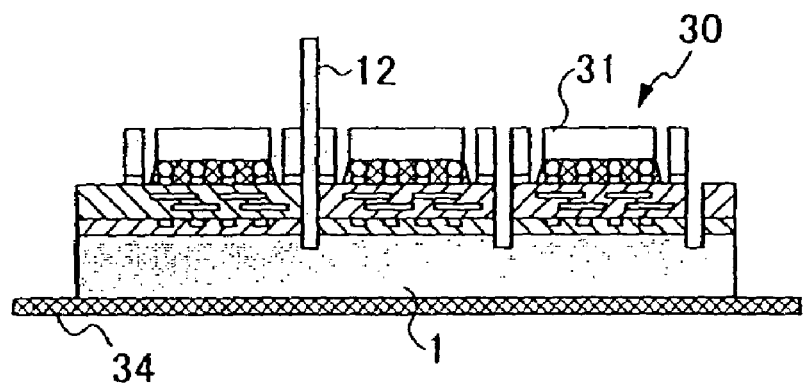
Figure 16D:
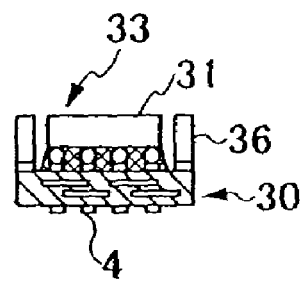

Then, as shown in FIG. 16C, a dicing process is performed to individualize the semiconductor devices 33 with the UV tape 34 being attached to the silicon wafer 1 (Si half-cutting or dicing). Then, the semiconductor devices 33 are peeled off from the resin layer 3 and the silicon wafer 1 such that the semiconductor device 33 shown in FIG. 16D is completed.

In the present embodiment, since the preformed rigid frames 36 are attached to the interposer 3 with an adhesive agent, it is possible to prevent a problem that the semiconductor devices (interposer) deform due to contraction of the sealing resin.

Figure 17:
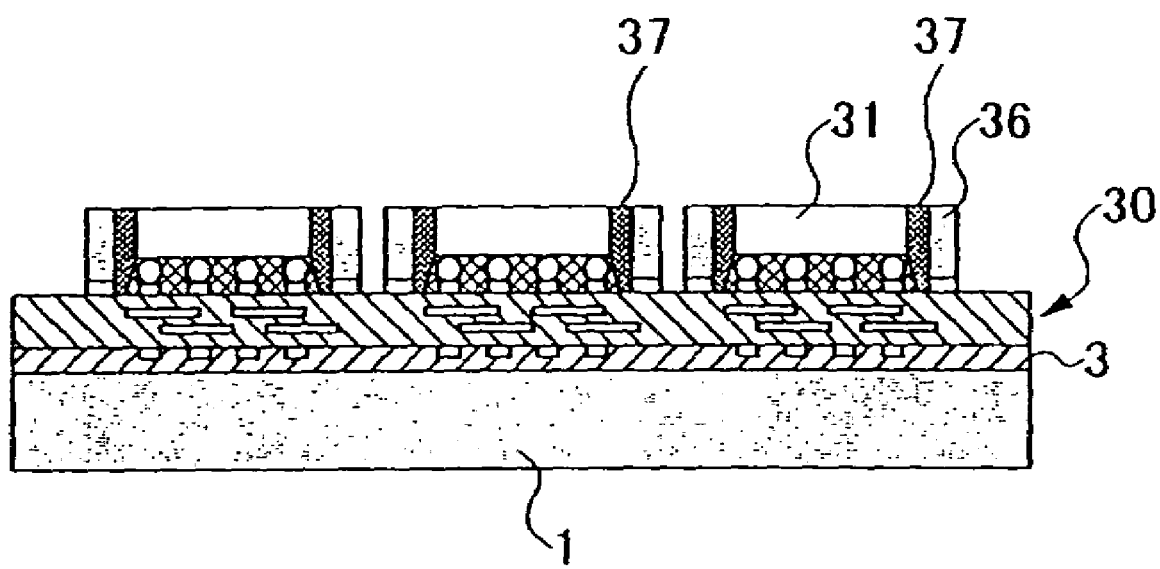
FIG. 17 is a diagram showing an example in which resin is filled between frames and semiconductor chips.

It is to be noted that, after providing the frames 36 as shown in FIG. 16B, the resin 37 may be filled between the frames 36 and the semiconductor chips 31 a shown in FIG. 17.

Figure 18:
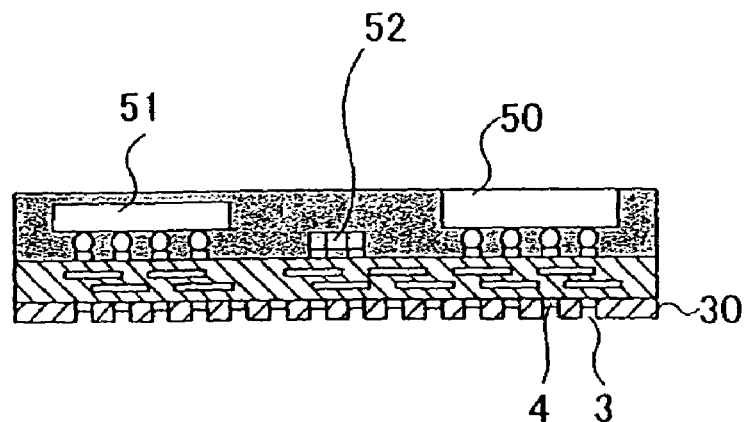
FIG. 18 is a diagram showing a semiconductor device formed by mounting a plurality of semiconductor chips and passive elements on the interposer of the present invention.
Figure 19:
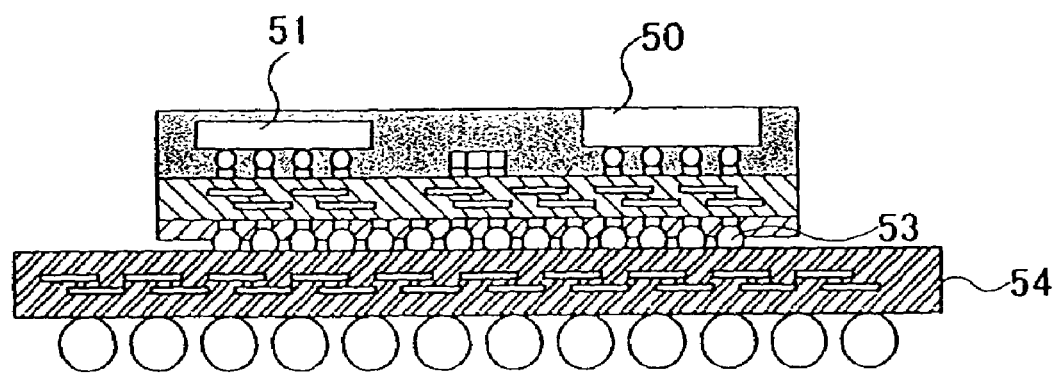
FIG. 19 is a diagram showing an example in which a semiconductor device using the interposer of the present invention is mounted on a package board.
Figure 20:
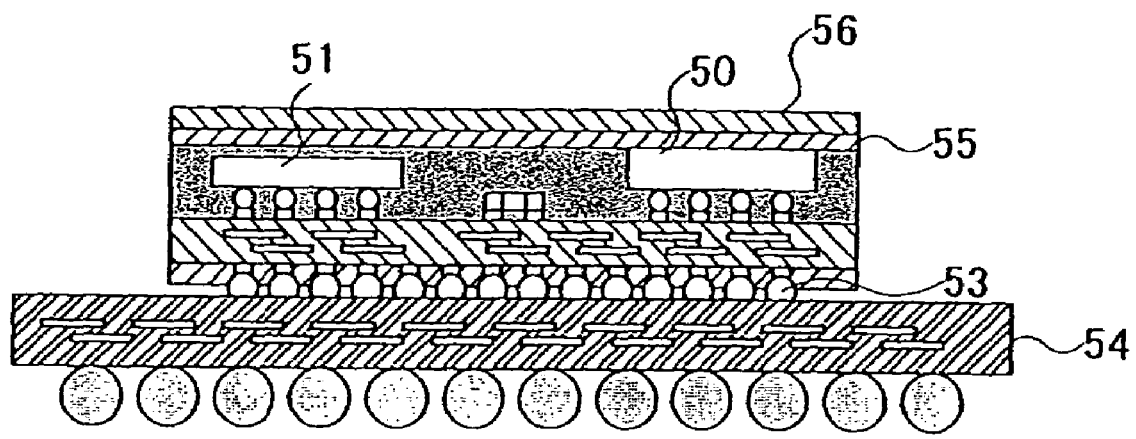
FIG. 20 is a diagram showing an example in which a heat spreader is provided on the semiconductor device shown in FIG. 19.

FIG. 18 is a diagram showing a semiconductor device that is formed by mounting a plurality of semiconductor chips and passive elements on the interposer of the present invention. Semiconductor chips 50 and 51 of different types are mounted on the interposer 30, and a capacitor serving as a passive element is mounted on the interposer 30. As can be seen in FIG. 19, solder balls 53 are provided on the lands 4 of the semiconductor device shown in FIG. 18. As can be seen in FIG. 19, the semiconductor device is mounted on a package substrate 54 made of an organic substrate or an inorganic substrate such as a ceramic substrate. The fine-pitched external connection terminals of the interposer 30 are substantially widened by the package substrate 54. Also, as shown FIG. 20, a heat spreader 56 such as a metal plate may be provided, via an adhesive agent 55 with a good thermal conductivity, on the backside of the semiconductor device where the semiconductor chip 50 is exposed.

Figure 21:
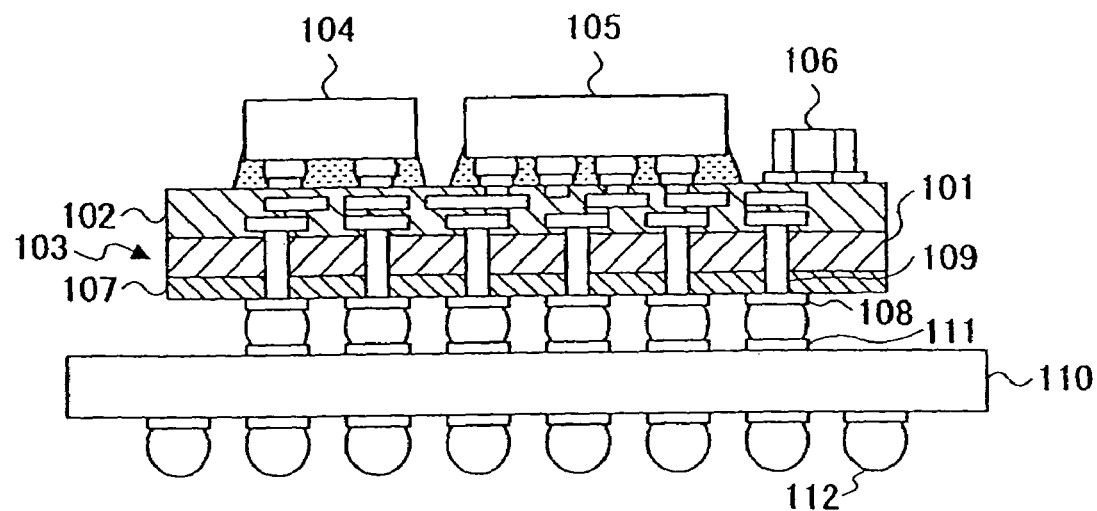
FIG. 21 is a cross-sectional diagram of a semiconductor device in which a plurality of LSI chips are mounted on an interposer that is formed using a silicon substrate.

Now, a semiconductor device is considered in which a plurality of semiconductor chips such as LSI chips are mounted on an interposer. FIG. 21 is a cross-sectional diagram of the semiconductor device formed by mounting a plurality of LSI chips on a wiring substrate that is formed using a silicon substrate. The semiconductor device shown in FIG. 21 includes an interposer (wiring substrate) 103 that is formed by providing a multilayered wiring layer 102 on a silicon substrate (Si substrate) 101 of a thickness of about 50-200 μm.

In the example shown in FIG. 21, two LSI chips 104 and 105 and capacitors 106 (one of the capacitors is shown) serving as chip components are mounted on the wiring layer 102 of the interposer 103. An insulating layer 107 made of polyimide resin is formed on the backside of the interposer 103 and electrode pads 108 are formed on the frontside of the insulating layer 107. The electrode pads 108 are pattern connected to the wiring layer 102 by copper filled vias 9. In this manner, the LSI chips 104, 105 and the electrode pads 108 are electrically connected. The copper filled vias 109 are formed by filling copper plating in through-holes that are formed to penetrate through the silicon substrate 101 and the insulating layer 107.

The electrode pads 108 of the interposer 103 are connected to electrodes 111 provided on a glass-ceramic substrate 110 serving as a package substrate by solder balls and solder bumps. Solder balls 112 serving as external connection terminals are provided on the backside of the glass-ceramic substrate 110. Thus, the semiconductor device is formed.

For the semiconductor device shown in FIG. 21, it is necessary to fill copper plating into the through-holes formed through the Si substrate 101 and the insulating layer 107 of the interposer 102. The thickness of the Si substrate 101 is about 50-200 μm and a special process is required to form small through-holes through a substrate having such a thickness. For example, it is necessary to form through-holes by inductively coupled plasma-reactive ion etching (ICP-RIE) and apply an insulating process to the inner surfaces of the through-holes by CVD. These comparatively expensive processes result in increased manufacturing cost of the semiconductor device. Further, during a process of filling copper plating in the through-holes, it is technically difficult to prevent voids that may lead to lower conductivity and reduced reliability.

Also, since the silicon substrate 101 has a very small thickness of about 50-200 μm, it is difficult to handle the interposer as a single body during the manufacturing process.

As shown in the figure, the wiring layer 102 is provided on one of the sides of the silicon substrate 101 and the insulating layer 107 is provided on the other side of the silicon substrate 101. Therefore, it is likely that the interposer 103 warps. That is, since the wiring layer 102 has a multilayered structure and its thickness is greater than that of the insulating layer 107, a warp may occur due to a difference of the thicknesses. In a case where the interposer 103 warps, there is also a problem that it becomes difficult to mount LSI chips with fine-pitched electrodes on the interposer 103.

It is also noted that the silicon substrate 101 of the interposer 103 is a member that is necessary during the manufacturing process but is not always necessary to be contained in the completed semiconductor device. Therefore, there is another problem that the height (or thickness) of the semiconductor device includes the thickness of the Si substrate 101 that is not always necessary for the semiconductor device.

Figure 22:
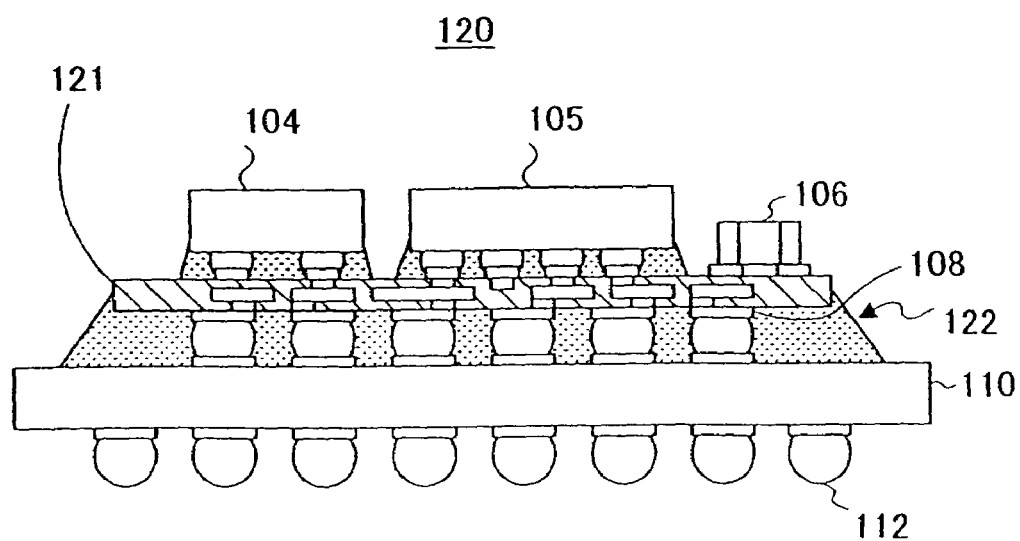
FIG. 22 is a cross sectional diagram of a semiconductor device according to a fifth embodiment of the present invention.

FIG. 22 is a cross-sectional diagram of a semiconductor device of a fifth embodiment of the present invention. As shown in FIG. 22, components that are equivalent to those shown in FIG. 21 are indicated with same numerals as in FIG. 21.

A semiconductor device 120 of the fifth embodiment of the present invention is fabricated by mounting the LSI chips 104, 105 on a thin-film multilayer substrate 121 and mounting the thin-film multilayer substrate 121 on a package substrate 110. The thin-film multilayer substrate 121 corresponds to the interposer 102 shown in FIG. 21. An underfill 122 is filled between the thin-film multilayer substrate 121 and the package substrate 110 and the thin-film multilayer substrate 12 is fixed on the packaging layer 110 that has a relatively high rigidity. The thin-film multilayer substrate 121 is fabricated by stacking insulating layers such as polyimide and BCB (Benzo-Cyclo-Butene) and wiring layers such as copper (Cu). The package substrate 110 is a substrate that has a comparatively good rigidity such as a glass-ceramic substrate (GC substrate) or build-up substrates. Also, since the wiring multilayer substrate 121 is attached to the package substrate 110 such as by soldering, it is not necessary to fill the underfill 122.

As can be seen from a comparison between FIG. 21 and FIG. 22, the thin-film multilayer substrate 121 is the only part that serves as a wiring substrate in the semiconductor device 120 shown in FIG. 22. That is, the semiconductor device 120 is not provided with the Si substrate 101 and the insulating layer 107 shown in FIG. 21. Therefore, the copper vias 109 penetrating through the Si substrate 101 can be dispensed with and also it is not necessary to form through-holes for providing the copper vias 109.

As has been described above, since the semiconductor device 120 does not include a Si substrate as a wiring substrate, the step of forming copper vias through the Si substrate can be omitted and thus the manufacturing cost can be reduced. Also, the height (thickness) of the semiconductor device can be reduced by an amount corresponding to the thicknesses of the Si substrate and of the insulating layer.

The semiconductor device 120 shown in FIG. 22 is configured such that connections between the thin-film multilayer substrate 121 and the package substrate 110 are connections of a ball-grid-array (BGA) structure. However, it is to be noted that the connections may be of a land-grid-array (LGA) structure shown in FIG. 23.

Now, a manufacturing process of the semiconductor device 120 shown in FIG. 22 will be described with reference to FIGS. 24 through 34. FIGS. 24, 26, and 28-34 show various steps of the manufacturing method of the semiconductor device 120.

Figure 24:
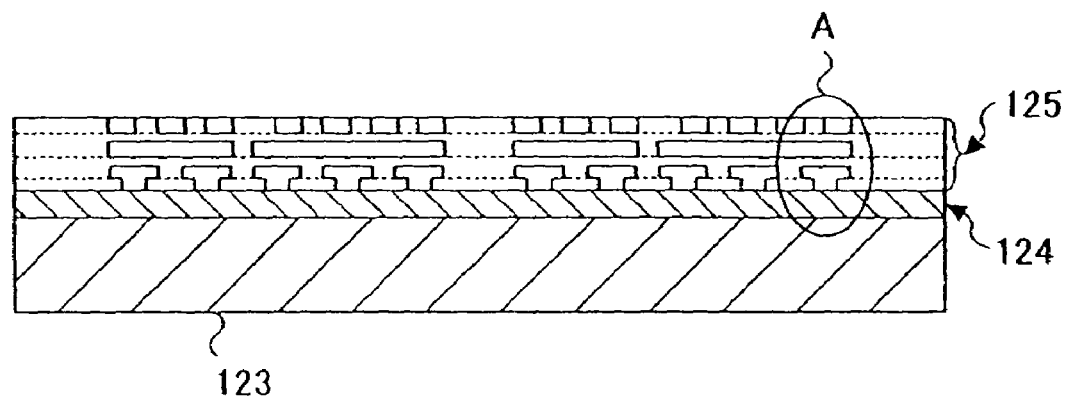
FIG. 24 is a diagram showing a first step of a method of manufacturing the semiconductor device shown in FIG. 22.

First, as shown in FIG. 24, a metal thin-film layer 124 is formed on a silicon wafer 123 having a thickness of about 500-700 μm, and the thin-film wiring layer 125 is formed on the metal thin-film layer 124. The thin-film wiring layer 125 corresponds to the thin-film multilayer substrate 12 shown in FIG. 22. The steps described above can be carried out using apparatuses that are used for normal wafer processes and are capable of providing the thin-film wiring layer 125 of a fine multilayered structure.

Figure 25:
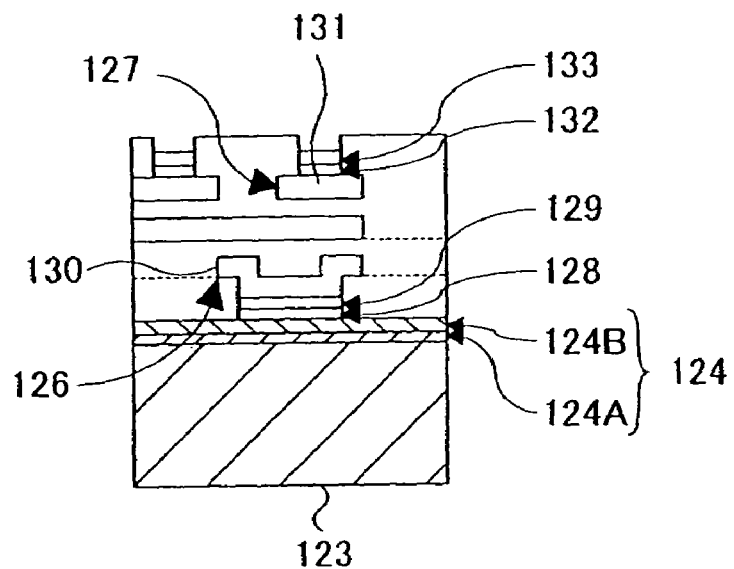
FIG. 25 is an enlarged diagram of a circled part indicated by "A" in FIG. 24.

FIG. 25 is an enlarged diagram of a circled part labeled "A" in FIG. 24. As can be seen from FIG. 25, the metal thin-film layer 124 includes Ti sputtering layer 124A formed on the silicon wafer 123 and a Cu sputtering layer 124B formed on the Ti sputtering layer 124A. Accordingly, the thin-film wiring layer 125 is formed on the Cu sputtering layer 124B. The Ti sputtering layer 124A may be replaced by a Cu sputtering layer or a Ni sputtering layer. The metal thin-film layer 124 serves as a shield layer while forming wiring sputtering layers on the silicon wafer 123.

The thin-film wiring layer 125 is a structure in which wiring patterns of copper plating layers are formed between insulating layers such as polyimide and is formed by a normal method of manufacturing the multilayer wiring substrate. As can be seen from FIG. 25, lower electrodes 126 and upper electrodes 127 are formed inside the thin-film wiring layer 125. The lower electrodes 126 are exposed when the silicon wafer is removed as will be described below, and serve as electrode pads for external connection terminals of the wiring substrate. The upper electrodes 127 serve as electrode pads whereon the LSI chips 104, 105 and chip components are to be mounted.

The lower electrodes 126 are made of a gold (Au) plating layer 128 formed on the Cu sputtering layer 124B, a nickel (Ni) plating layer 129 formed on the gold (Au) plating layer 128, and a copper (Cu) plating layer 130 formed on the nickel (Ni) plating layer 129. The Cu plating layer 103 is the main body of the electrode pad, the Au plating layer 128 is provided for ensuring solder wetting, and the Ni plating layer 129 serves as a barrier metal layer for preventing the solder from being diffused. In the etching process described below, the Au plating layer 128 also serves as a barrier layer for preventing etching of the lower electrodes.

The upper electrodes 127 have similar structures as the lower electrodes 128, and therefore, a nickel (Ni) plating layer 132 is formed on a copper (Cu) plating layer 131 and then a gold (Au) layer 133 is formed thereon.

It is also possible to form electrodes in the thin-film wiring layer 115 so as to oppose the lower electrodes and the upper electrodes such that internal capacitors are formed by providing a material having a high relative permittivity between them.

Figure 26:
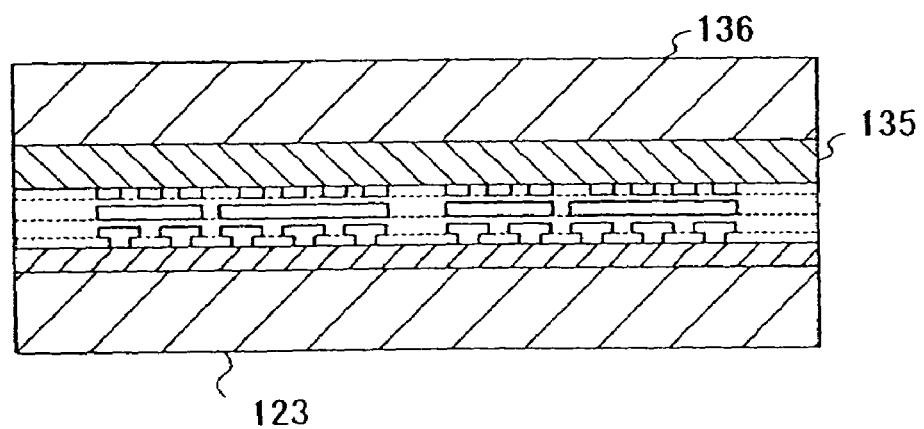
FIG. 26 is a diagram showing a second step of a method of manufacturing the semiconductor device shown in FIG. 22.
Figure 27:
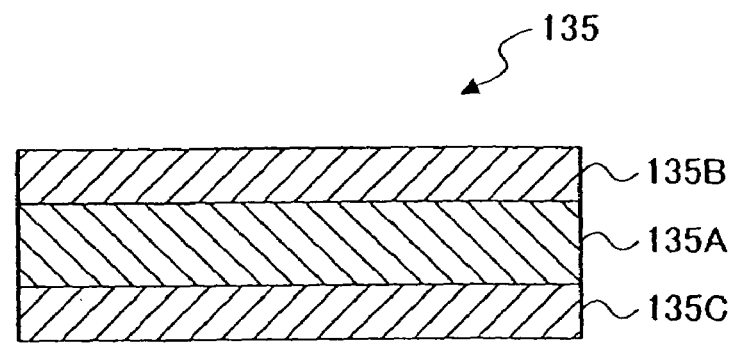
FIG. 27 is a cross-sectional diagram showing the structure of an adhesive film shown in FIG. 26.

Then, as shown in FIG. 26, a supporting member 136 such as a glass plate is attached on top of the thin-film wiring layer 125 by means of an adhesive film 135. The supporting member 136 is attached such that it is held in a flat state with the thin-film wiring layer for easy handing during the manufacturing step. FIG. 27 is a cross-sectional diagram showing the structure of the adhesive film 135. The adhesive film 135 includes a polyethylene (PET) film 135A, a normal adhesive agent 135B applied on one of the sides of the PET film 135A and a thermal foam adhesive material or a UV-curing adhesive material 135C on the other side of the PET film 135A.

As for the adhesive film 135, the adhesive agent 135B is for adhering a glass plate that serves as the supporting member 136 and the thermal foam adhesive material or UV-curing adhesive material 135C is for adhering the thin-film wiring layer 125. The thermal foam adhesive material 135C is an adhesive material having a property such that if it is heated to a temperature exceeding a predetermined temperature, foam is produced inside the thermal foam adhesive material 135C and thus the adhesiveness is decreased. The UV-curing adhesive material 135C is an adhesive material having a property such that it cures if an ultraviolet radiation is irradiated thereon, and thus the adhesiveness is decreased. It is also possible to provide the thermal foam adhesive material or UV-curing adhesive material 135C as an adhesive layer directly on the supporting member 136.

Figure 28:
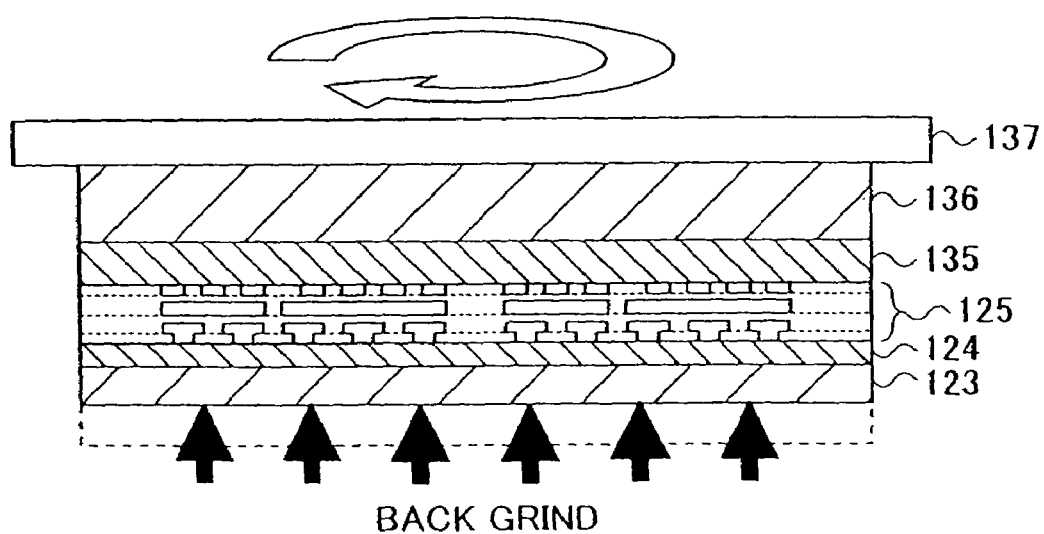
FIG. 28 is a diagram showing a third step of a method of manufacturing the semiconductor device shown in FIG. 22.
Figure 29:
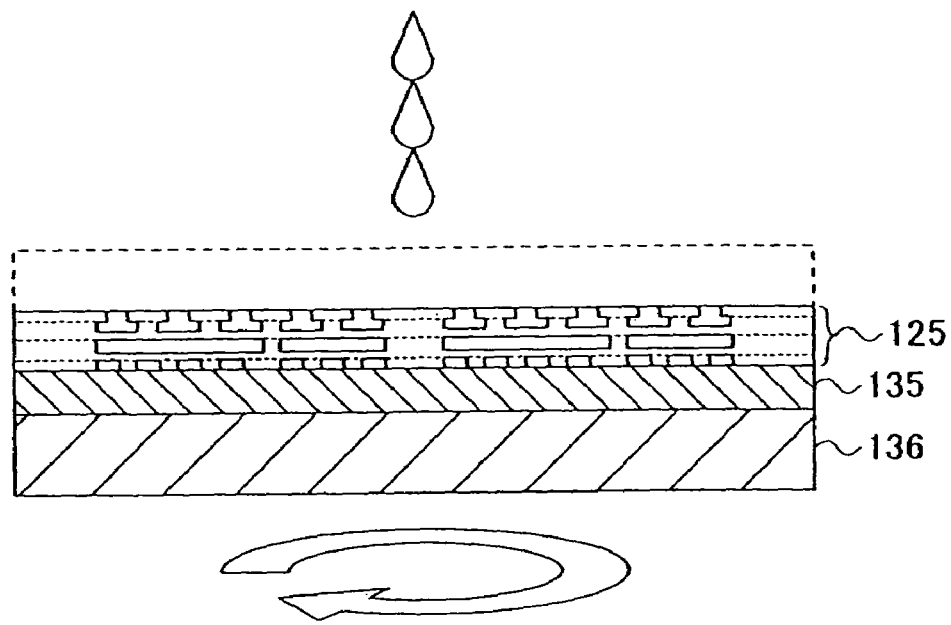
FIG. 29 is a diagram showing a fourth step of a method of manufacturing the semiconductor device shown in FIG. 22.

Then, as shown in FIG. 28, a back-grind (BG) tape 137 is applied to the supporting member 136 and the silicon wafer 123 is ground while rotating the supporting member 136 (back grinding). The silicon wafer 123 is ground until its thickness is reduced to about 50 μm. Then, as shown in FIG. 29, the thinned silicon wafer 123 is placed facing upward and a spin-etching process is carried out while rotating the silicon wafer 123 so as to remove the remaining part of the silicon wafer 123 and the metal thin-film layer 124. Thereby, an insulating layer which is the lowermost layer of the thin-film wiring layer 25 and the Au plating layer 128 of the lower electrode 126 is exposed.

In the present embodiment, etchant for the spin-etching process is hydrofluoric-nitric acid (5% HF+55% $HNO_3$+$H_2O$). Hydrofluoric-nitric acid dissolves silicon, and Ti and Cu, however, it does not dissolve the Au plating layer or the polyimide insulating layers. Therefore, only the remaining part of the silicon wafer 123 that has not been ground dissolves into the hydrofluoric-nitric acid and is removed. Accordingly, the lowermost insulating layer of the thin-film wiring layer 125 and the Au plating layer 128 of the lower electrodes 126 are exposed.

After the spin-etching process, hydrofluoric-nitric acid is neutralized, cleansed and then dried. The neutralization process of the hydrofluoric-nitric acid can be performed by a spinning process while dropping sodium phosphate on the exposed surface. That is, the hydrofluoric-nitric acid that remains on the exposed surface is neutralized by dropping sodium phosphate (trisodium phosphate). Thereafter, the exposed surface is cleansed with deionized water and dried by blowing dry air or nitrogen.

The trisodium phosphate used as a neutralizing agent has a chemical formula of $Na_3PO_4.6H_2O$. Concentration of trisodium phosphate is preferably 5 wt % (about 0.1-10% is a practical range) and the temperature is preferably 50° C. (Celsius) (20-70° C. is a usable range). Also, the time required for the neutralization process is about 10-20 seconds.

Figure 23:
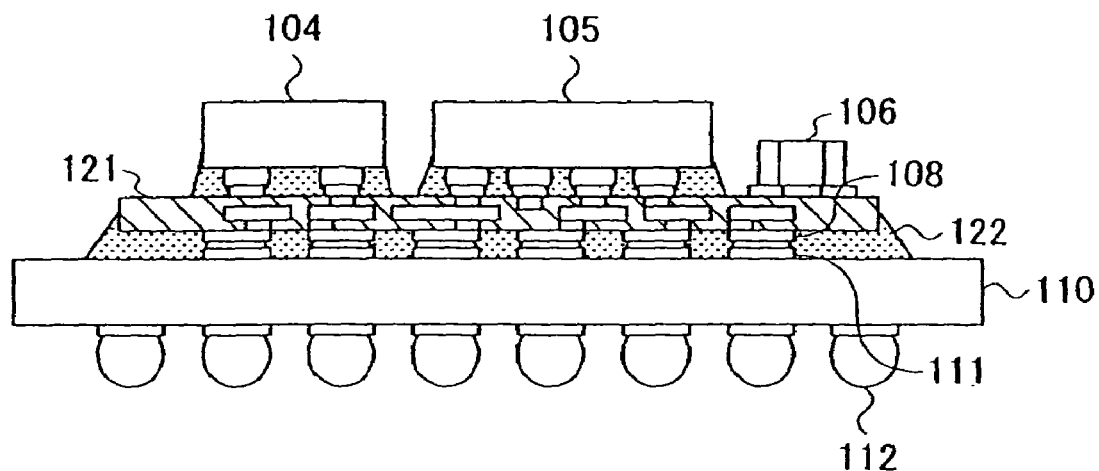
FIG. 23 is a cross sectional diagram of a variant of the semiconductor device of the fifth embodiment of the present invention.
Figure 30:
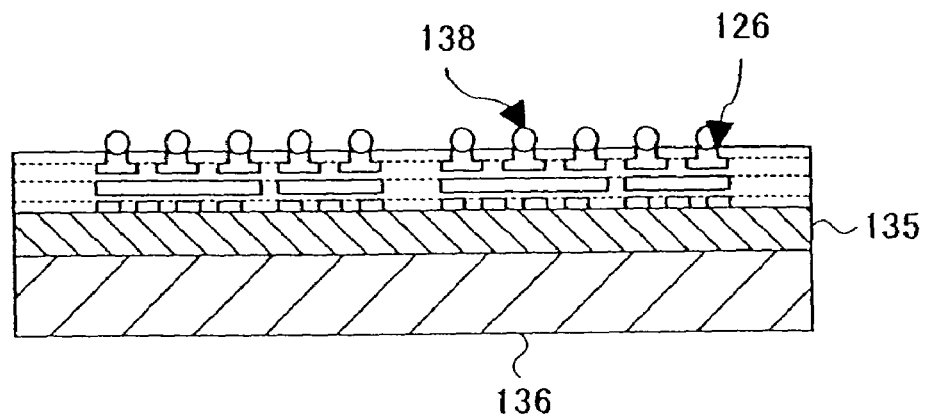
FIG. 30 is a diagram showing a fifth step of a method of manufacturing the semiconductor device shown in FIG. 22.

Then, as shown in FIG. 30, in a state where the thin-film wiring layer 125 is fixed on the supporting member 136, solder bumps 138 are formed on the Au plating layer 128 of the exposed lower electrodes 126. In general, the solder bumps 138 are formed by a plating process. If the adhering film 135 uses the thermal foam adhesive material 135C, it is necessary to maintain the processing temperature at a temperature lower than the temperature at which the thermal foam adhesive material 135C starts to foam. Also, in case of a LGA structure as shown in FIG. 23, it is not necessary to provide solder bumps 138. Here, since the thin-film layering layer 126 is fixed on supporting member 136, a photolithography process for forming plating bumps can be performed on the thin-film wiring layers 125.

Figure 31:
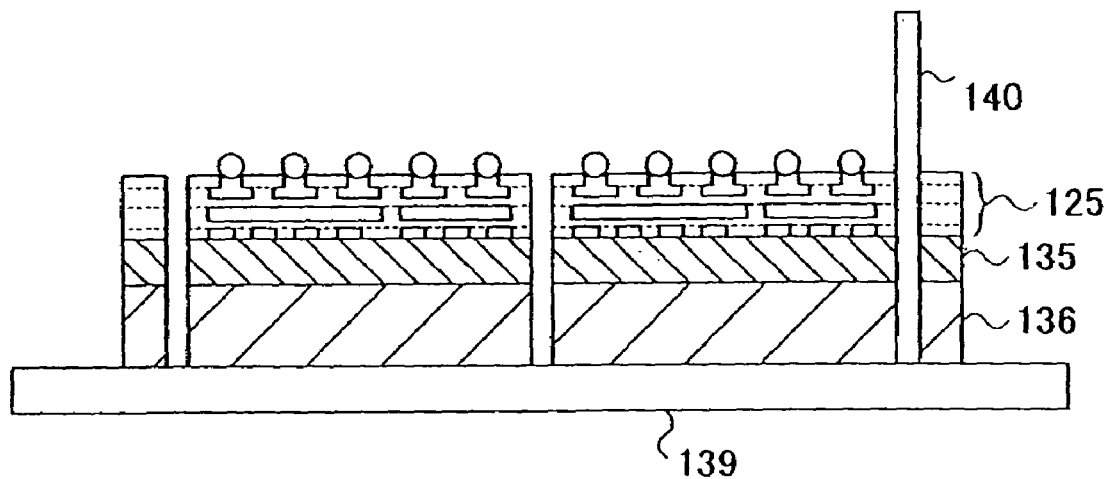
FIG. 31 is a diagram showing a sixth step of a method of manufacturing the semiconductor device shown in FIG. 22.

Then, as shown in FIG. 31, a dicing tape 139 is attached to the supporting member 131 and the thin-film firing layer 125 is cut and individualized by means of a dicing blade 140. At the same time, the adhesive film 135 and the supporting member 136 are also cut. In this manner, the individualized thin-film wiring layer 125 (corresponds to the thin-film multilayer substrate 121 in FIG. 22) is held in a state fixed on the supporting member 136.

Figure 32:
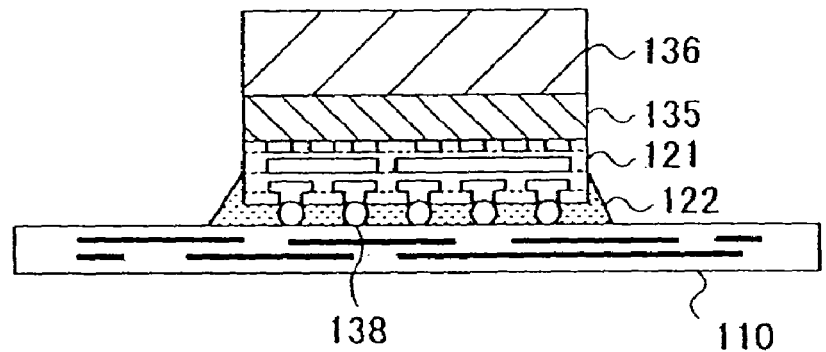
FIG. 32 is a diagram showing a seventh step of a method of manufacturing the semiconductor device shown in FIG. 22.

Then, as shown in FIG. 32, the individualized thin-film multilayer substrate 121 is connected to the package substrate 110 via the solder bumps 138 by flip-chip bonding. The thin-film multilayer substrate 121 remains in a good flatness and the coplanarity of the solder bumps are good since the thin-film multilayer substrate 121 is fixed on the supporting member 136 made of a glass plate. Therefore, the thin-film multilayer substrate 121 having a fine structure can be easily mounted on the package substrate. To do this, the bonding temperature should be lower than the foaming start temperature of the adhesive film. Thereafter, the underfill 122 is filled between the thin-film multilayer substrate 121 and the package substrate 110 and the underfill 122 is cured.

Figure 33:
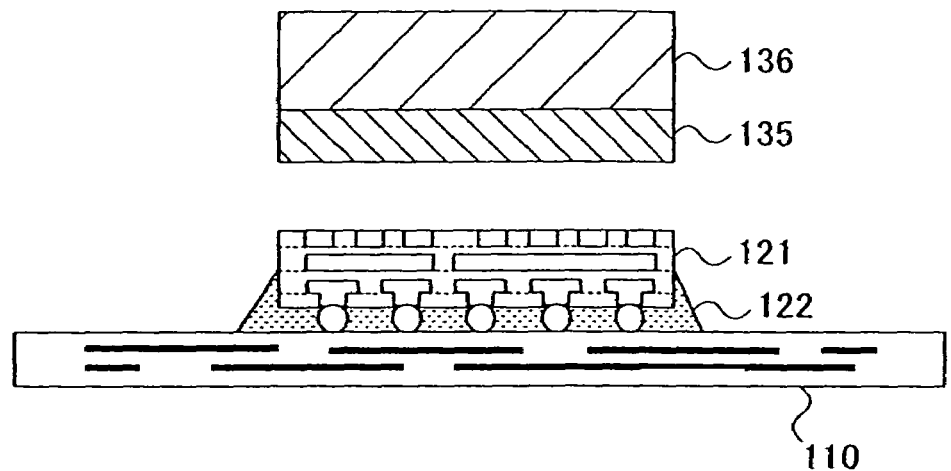
FIG. 33 is a diagram showing an eighth step of a method of manufacturing the semiconductor device shown in FIG. 22.

After curing the underfill 122, as shown in FIG. 33, the adhesive film 135 is peeled off from the thin-film multilayer substrate 121. In a case where the thermal foam adhesive material 135C is used for the adhesive film 135, the adhesiveness is decreased by heating until the temperature exceeds the foaming start temperature so as to cause a separation between the adhesive material 135 and the thin-film multilayer substrate 121 and to remove the adhesive film 135. Heating of the adhesive material 135C may be performed simultaneously to the heating for curing the underfill 122. In a case where a UV curing foam adhesive material 135C is used for the adhesive film 135, ultraviolet radiation is irradiated on the adhesive material 135C via the supporting member 136 made of a glass plate so as to decrease adhesiveness. Then, the adhesive material 135C and the thin-film multilayer substrate 121 are separated to remove the adhesive film 135.

Figure 34:
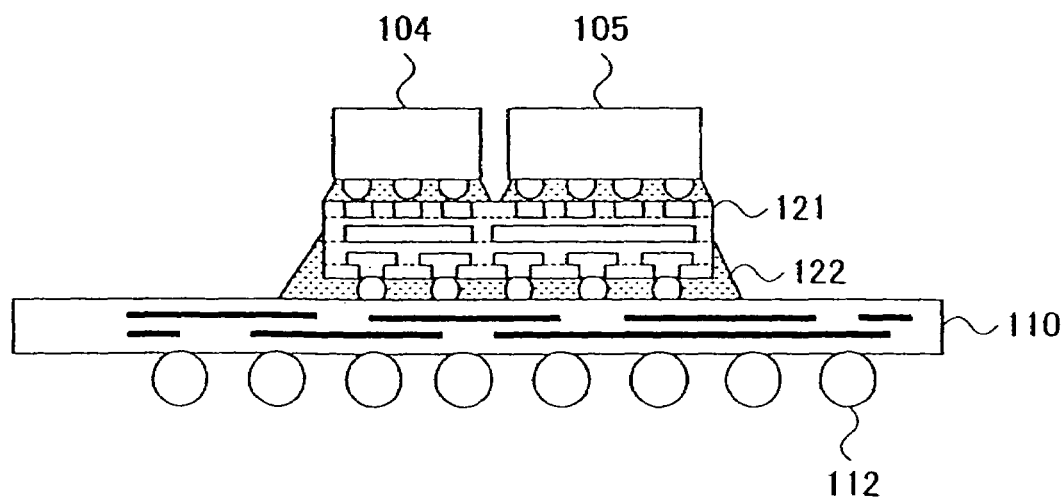
FIG. 34 is a diagram showing a ninth step of a method of manufacturing the semiconductor device shown in FIG. 22.

Then, as shown in FIG. 34, the LSI chips 104, 105 are mounted on the thin-film multilayer substrate 121 by flip-chip connecting and also the chip component 106 (not shown) is mounted on the thin-film multilayer substrate 121. Then, the underfill 139 is filled between the LSI chips 104, 105 and the thin-film multilayer substrate 121. Then, solder balls 112 that serve as external connection terminals are provided on the back surface of the package substrate 110 to complete the semiconductor device 120 shown in FIG. 22.

Figure 35:
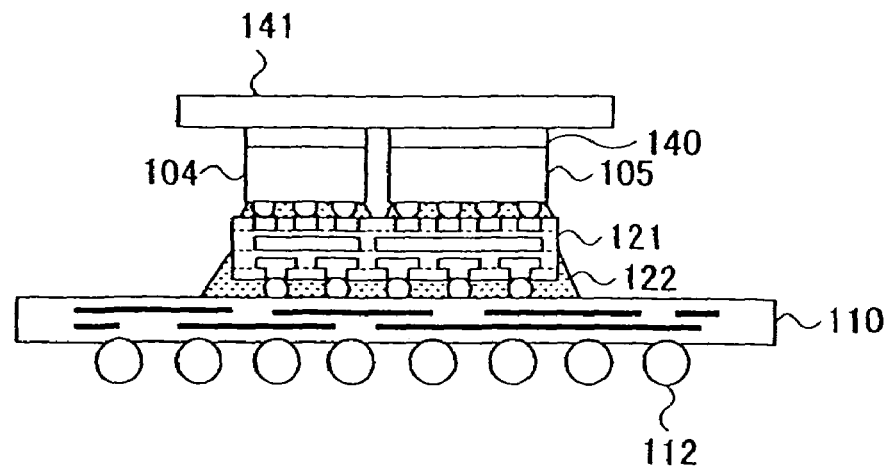
FIG. 35 is a cross-sectional diagram showing a variant of the semiconductor device shown in FIG. 22.

Also, as shown in FIG. 35, a heat spreader or a heat sink 141 may be attached on top of the LSI chips 104, 105 of the semiconductor device 120 via solder (Ag) paste 140 in order to accelerate heat dissipation.

According to the manufacturing process of the semiconductor device 120, the thin-film wiring layer 125 is fixed in a flat state by means of the supporting member 136. Therefore, there is no need to provide copper vias that penetrate through the silicon substrate. Also, the thin-film wiring layer 125 is individualized into the thin-film multilayer substrates 121 and mounted on the package substrate 110 and then removed by peeling off from the supporting member 136. Therefore, the thin-film multilayer substrates 121 is always fixed in a flat state and thus easy handling is achieved.

Figure 36:
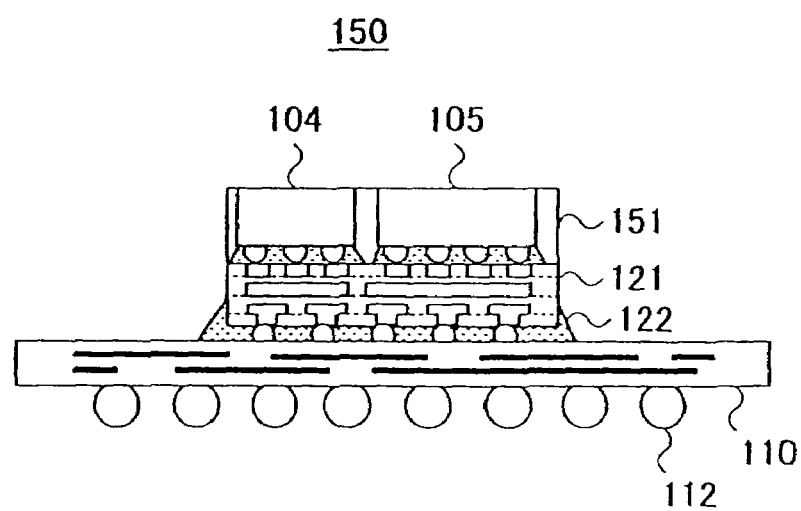
FIG. 36 is a cross-sectional diagram of a semiconductor device according to a sixth embodiment of the present invention.

Now, a semiconductor device of the sixth embodiment of the present embodiment will be described. FIG. 36 is a cross-sectional diagram of a semiconductor device 150 of the sixth embodiment of the present invention. In FIG. 36, components equivalent to those of the semiconductor device 120 shown in FIG. 32 are indicated with corresponding reference numerals and detailed descriptions are omitted.

The semiconductor device 130 shown in FIG. 36 has a basic structure that is similar to the semiconductor device 120 except that the LSI chips 104, 105 of the semiconductor device 120 of the fifth embodiment described above are sealed with sealing resin.

FIGS. 37 through 43 are diagrams showing various steps of a manufacturing method of the semiconductor device 150 shown in FIG. 36 in a sequential manner. Manufacturing steps of the semiconductor device 150 are the same as manufacturing steps of the semiconductor device 120 up to the step of mounting the LSI chips 104, 105 on the thin-film wiring layer 125, and therefore, detailed description is omitted.

Figure 37:
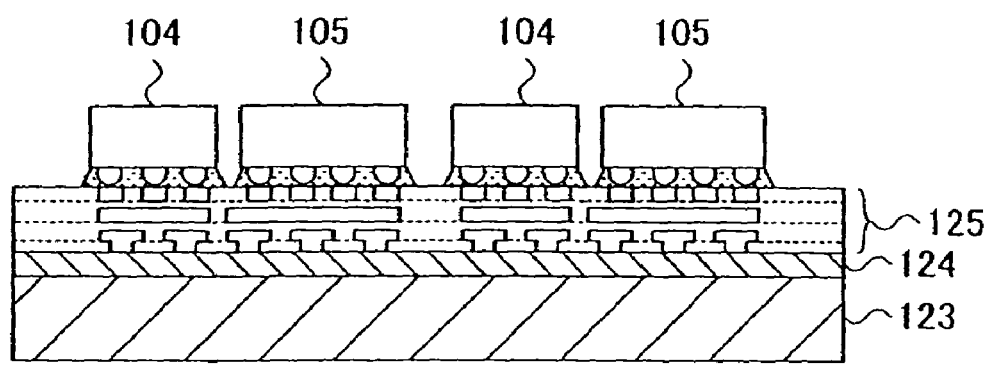
FIG. 37 is a diagram showing a first step of a method of manufacturing the semiconductor device shown in FIG. 36.
Figure 38:
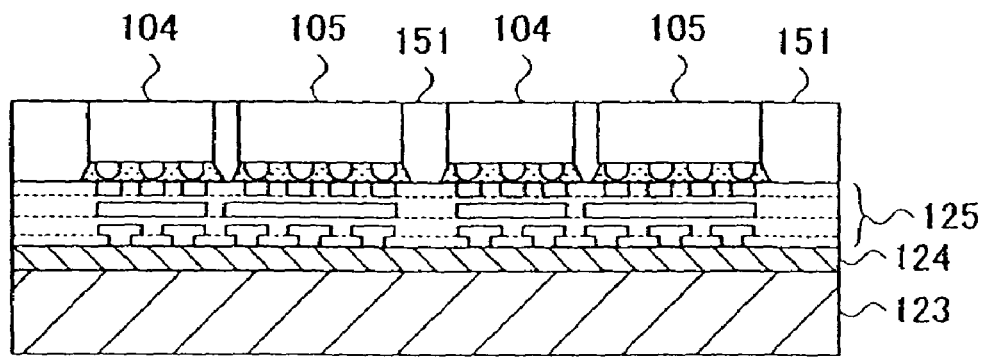
FIG. 38 is a diagram showing a second step of a method of manufacturing the semiconductor device shown in FIG. 36.

The LSI chips 104, 105 are mounted on the thin-film wiring layer 125 as shown in FIG. 37. Then, the LSI chips 104, 105 are sealed with the sealing resin 151 (of a mold type or a fluid resin type) of a material such as epoxy resin a shown in FIG. 38. The sealing resin 151 is filled between the LSI chips 104 and 105 such that the upper surface of the sealing resin 151 is flush with the back surface of the LSI chips 104 and 105. Therefore, a flat surface is formed by the upper surface of the sealing resin 151 and the back surfaces of the LSI chips 104 and 105.

The coefficient of linear expansion α of the sealing resin 151 is between 8 to 20 ppm ($\alpha=8 \ldots 20$ ppm), that is greater than the coefficient of linear expansion of silicon. Therefore, there is a possibility of an occurrence of a warp in the silicon wafer 123 due to the difference between the coefficients of linear expansion. However, in the present embodiment, the sealing resin 151 is only filled around the LSI chips 104 and 105 and thus the volume of the sealing resin 151 becomes smaller and thus the degree of warping will not be great even in a case there is a warp.

Figure 39:
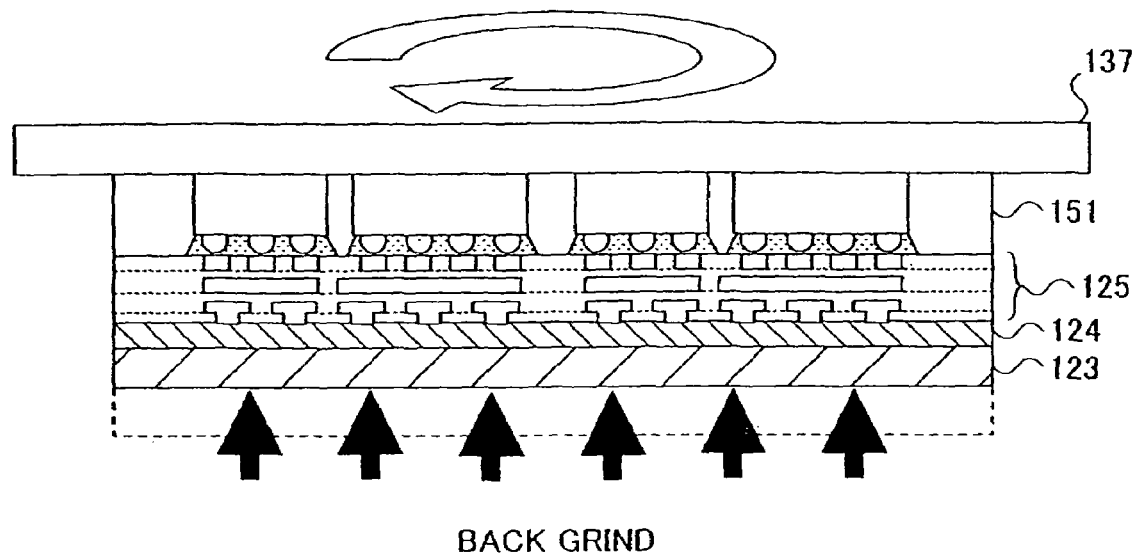
FIG. 39 is a diagram showing a third step of a method of manufacturing the semiconductor device shown in FIG. 36.
Figure 40:
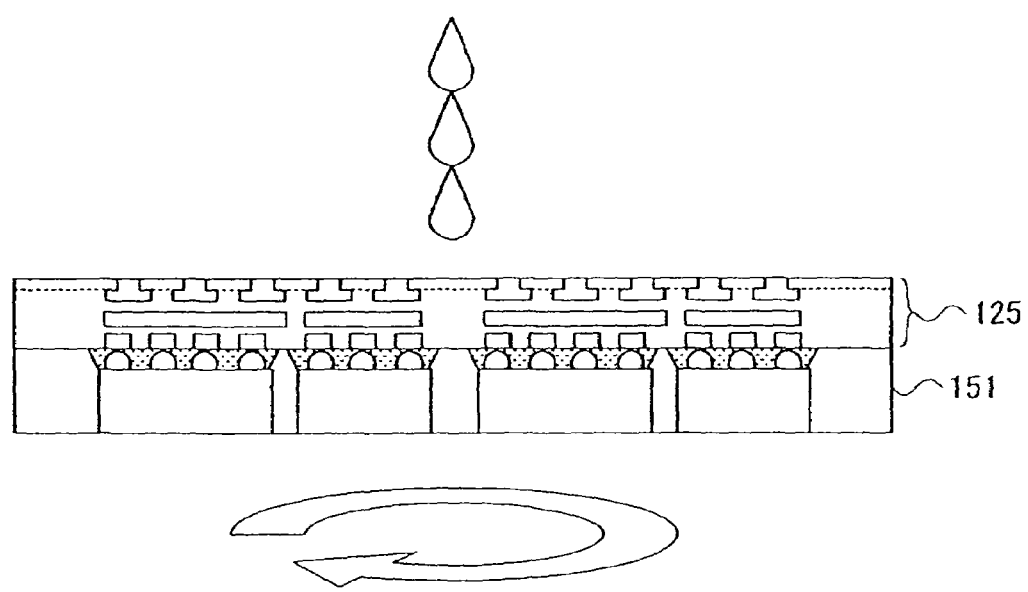
FIG. 40 is a diagram showing a fourth step of a method of manufacturing the semiconductor device shown in FIG. 36.

Then, as shown in FIG. 39, the back grind tape 137 is attached to the upper surface of the sealing resin 151 and the back surface of the LSI chips 104, 105. Then, the silicon wafer 123 is ground until the thickness is reduced to about 50 μm. In the present embodiment, the sealing resin 151 serves as a supporting member for maintaining the thin-film wiring layer 125 in a flat state. Therefore, it is not necessary to attach the supporting member 136 as in the fifth embodiment of the present invention. Then, as shown in FIG. 40, the remaining silicon wafer 123 and the metal thin-film layer 124 are removed by a spin-etching process using hydrofluoric-nitric acid. Then, the hydrofluoric-nitric acid is neutralized, cleansed and dried.

Figure 41:
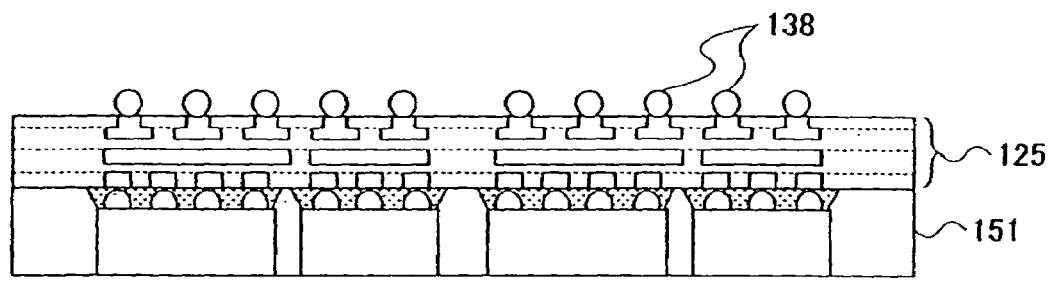
FIG. 41 is a diagram showing a fifth step of a method of manufacturing the semiconductor device shown in FIG. 36.
Figure 42:
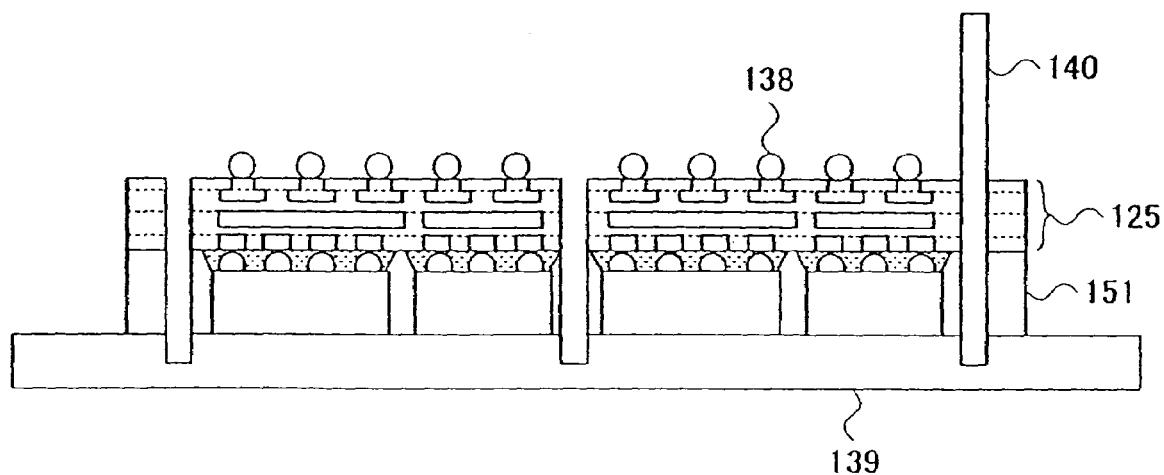
FIG. 42 is a diagram showing a sixth step of a method of manufacturing the semiconductor device shown in FIG. 36.

Then, as shown in FIG. 41, solder bumps 138 are formed on the Au plating layer 128 of the exposed lower electrodes 126. Then, as shown in FIG. 42, the dicing tape 139 is attached to the upper surface of the sealing resin 151 and the back surface of the LSI chips 104, 105. Then, the thin-film wiring layer 125 and the sealing resin 151 are cut and individualized by means of the dicing blade 140.

Figure 43:
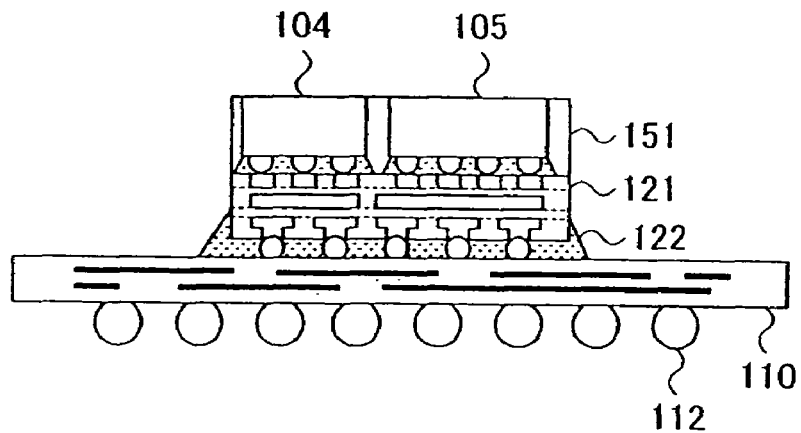
FIG. 43 is a diagram showing a seventh step of a method of manufacturing the semiconductor device shown in FIG. 36.

Then, as shown in FIG. 43, the individualized thin-film multilayer substrate 121 is connected to the package substrate 110 via the solder bumps 138 by flip-chip bonding. The thin-film multilayer substrate 121 remains in a good flatness and the coplanarity of the solder bumps 138 are good since the thin-film multilayer substrate 121 is fixed by the sealing resin 151. Therefore, the thin-film multilayer substrate 121 having a fine structure can be easily mounted on the package substrate. Thereafter, the underfill 122 is filled between the thin-film multilayer substrate 121 and the package substrate 110 and the underfill 122 is cured. In this manner, the semiconductor device 150 shown in FIG. 36 is completed.

Figure 44:
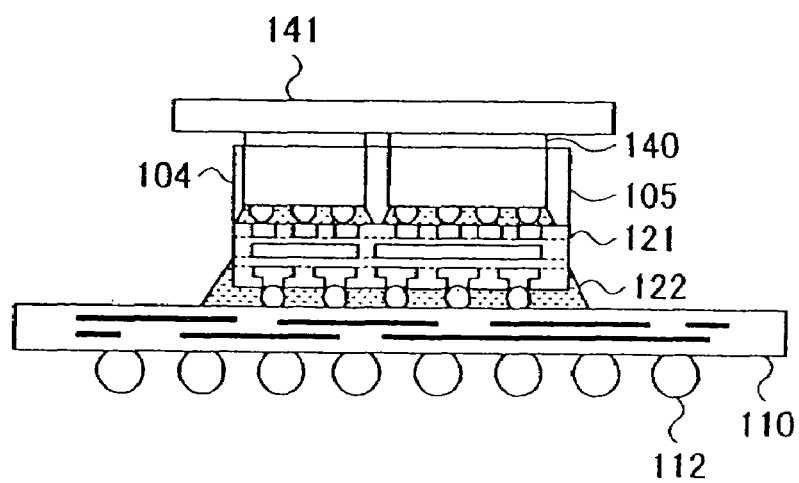
FIG. 44 is a cross-sectional diagram showing a variant of the semiconductor device shown in FIG. 36.

Also, as shown in FIG. 44, a heat spreader or a heat sink 141 may be attached on top of the LSI chips 104, 105 of the semiconductor device 120 via the solder (Ag) paste 140 in order to accelerate heat dissipation.

Figure 45:
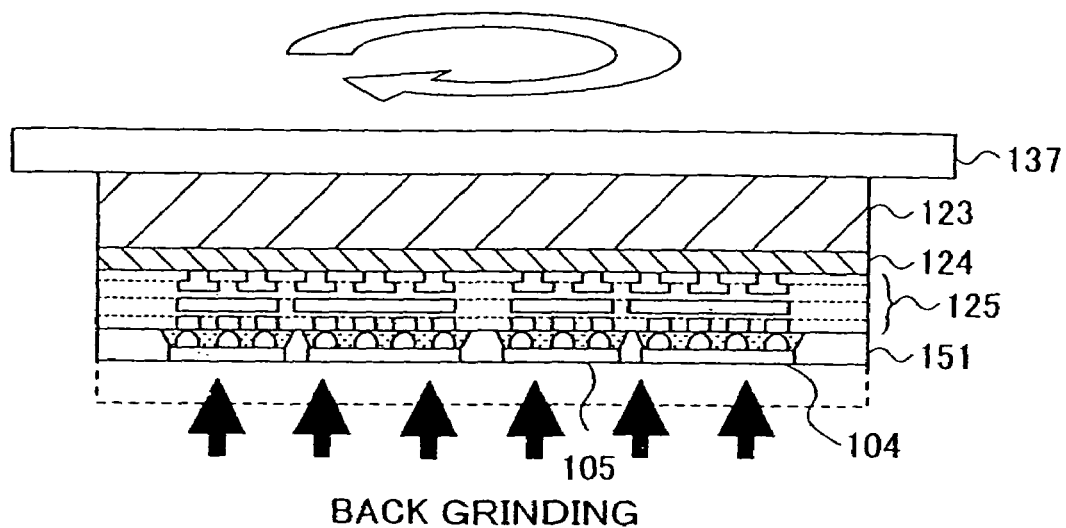
FIG. 45 is a diagram showing a process of grinding the backside of the LSI chips of the semiconductor device shown in FIG. 36.
Figure 46:
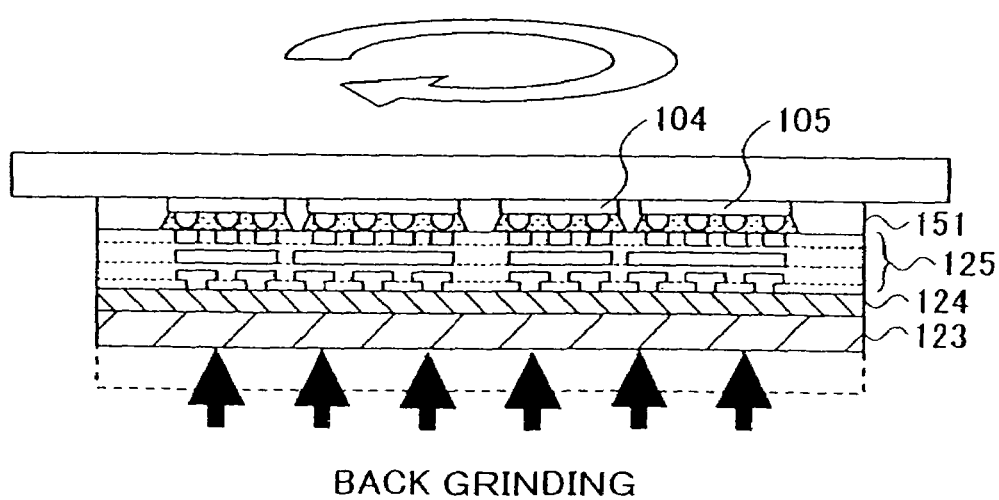
FIG. 46 is a diagram showing a step after grinding the backside of the LSI chips of the semiconductor device shown in FIG. 36.

Also, in the manufacturing process described above, before the back grinding step shown in FIG. 39, the back surface of the LSI chips 104, 105 and the sealing resin 151 may be ground as shown in FIG. 45. In other words, after grinding the back surface of the LSI chips 104, 105 and the sealing resin 151 as shown in FIG. 45, the silicon wafer 23 is ground as shown in FIG. 46. In this manner, the LSI chips 104, 105 and the upper surface of the sealing resin 151 can be further flattened. Also, the thickness of the semiconductor device 150 can be reduced. Further, since the volume of the sealing resin 151 is reduced, occurrence of a warp can be prevented.

Now, variants that may be applied to the fifth and sixth embodiments will be described.

Figure 47:
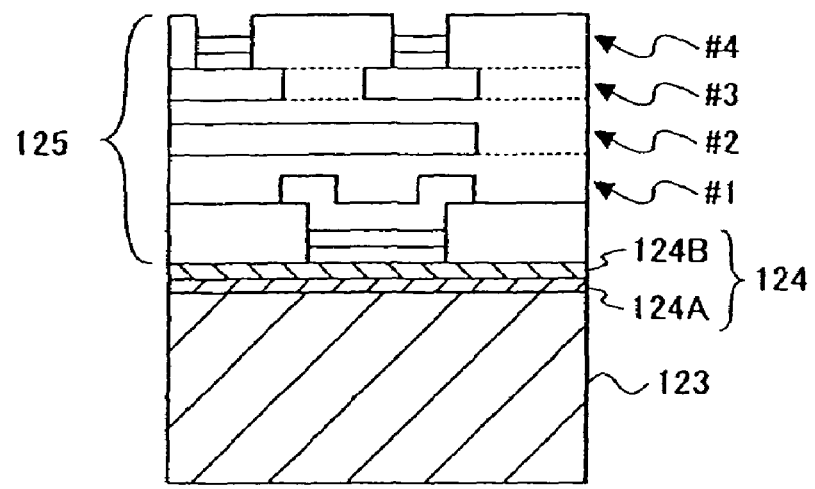
FIG. 47 is a cross-sectional diagram showing a variant of the thin-film wiring layer.

FIG. 47 is an enlarged cross-sectional diagram showing a variant of the thin-film wiring layer 125. Apart shown in FIG. 47 corresponds to part "A" of FIG. 24, that is, a part corresponding to FIG. 25. Referring to the thin-film wiring layer 125 of FIG. 47, insulating layers #1 through #4 are stacked and electrodes and wiring patterns are formed between the insulating layers. Here, it is assumed that the insulating material (e.g., polyimide) forming the insulating layer #1 that is nearest to the silicon wafer 123 is a low stress material (that is to say, a material having more flexibility) compared to an insulating material forming the remaining insulating layers #2 through #4. The reason for this is as follows.

Figure 48:
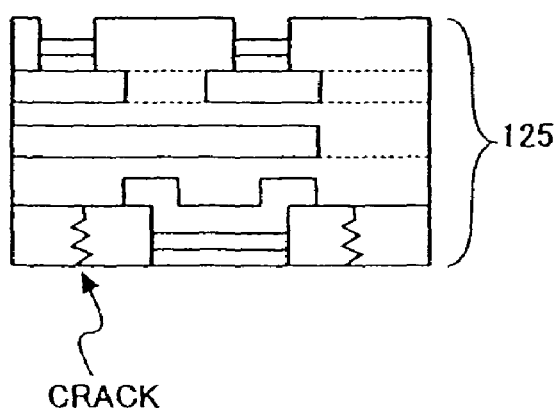
FIG. 48 is a diagram showing cracks that may occur in the thin-film wiring layer.

Normally, it is known that after curing the insulating thin-film such as polyimide, residual stress remains inside. As in the embodiment described above, in a case where the silicon wafer 123 and the metal thin-film layer 12 are removed by an etching process, the insulating layer having residual stress is exposed and released. Under such a state, cracks may occur as shown in FIG. 48 in the exposed insulating layer from the surface of the insulating layer due to the internal residual stress. Accordingly, as shown in FIG. 47, the insulating layer #1 should be made of a material having high flexibility, such that the residual stress is obviated and reduced and thus it is possible to prevent cracks from occurring in the surface of the insulating layer #1.

Figure 49:
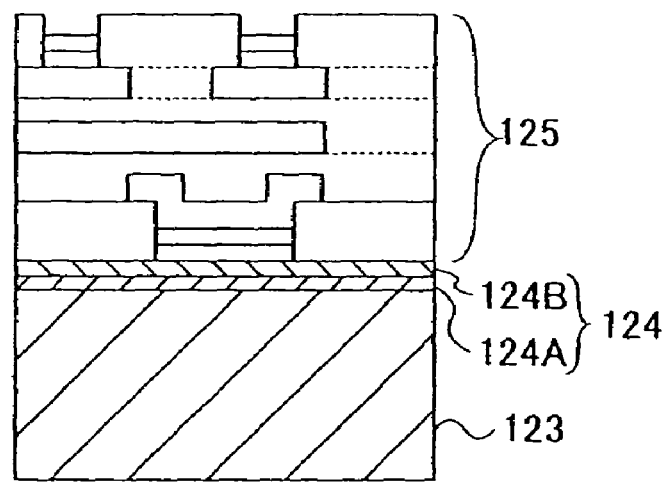
FIG. 49 is a diagram showing a first step of manufacturing the variant of the thin-film wiring layer.
Figure 50:
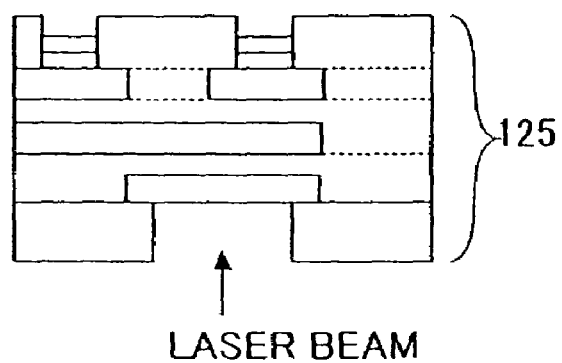
FIG. 50 is a diagram showing a second step of manufacturing the variant of the thin-film wiring layer.
Figure 51:
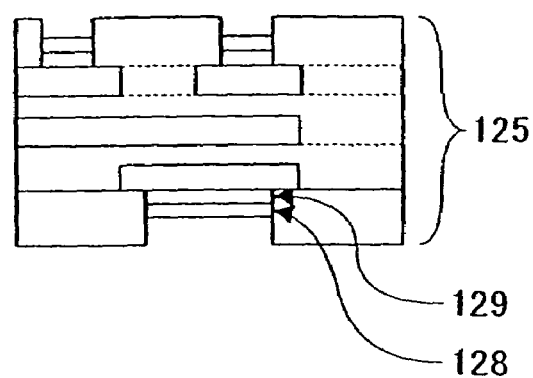
FIG. 51 is a diagram showing a third step of manufacturing the variant of the thin-film wiring layer.

Also, after removing the silicon wafer 123 by spin-etching, the lower electrodes 126 of the thin-film wiring layer 125 may be exposed by forming holes by a laser beam. That is, as shown in FIG. 49, the Cu plating layer 140 that is to become the lower electrodes 126 is formed on the insulating layer #1. Then, the silicon wafer 123 and the metal thin-film layer 124 are removed. Then, as shown in FIG. 50, openings are formed in the insulating layer #1 by a laser beam so as to expose the Cu plating layer 130. Then, as shown in FIG. 51, the Ni plating layer 129 and the Au plating layer 128 are formed on the Cu plating layer 130 by a non-electrolytic plating process.

Figure 52:
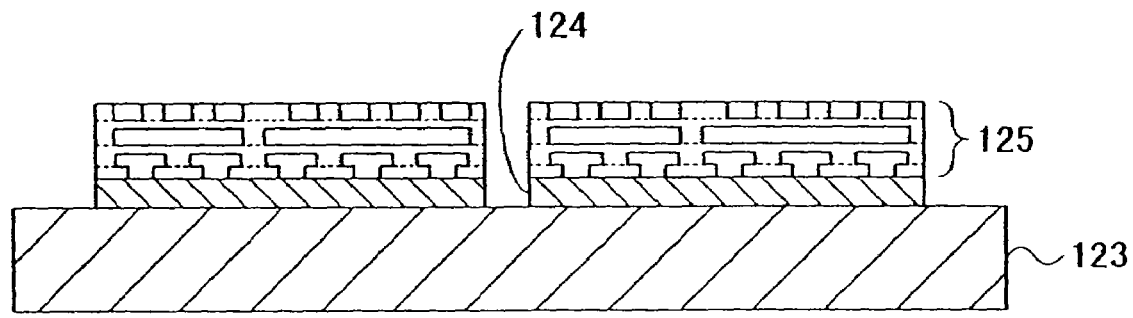
FIG. 52 is a diagram showing a step of individualizing the thin-film wiring layer in which the thin-film wiring layer is separated during the step of forming the thin-film wiring layer.
Figure 53:
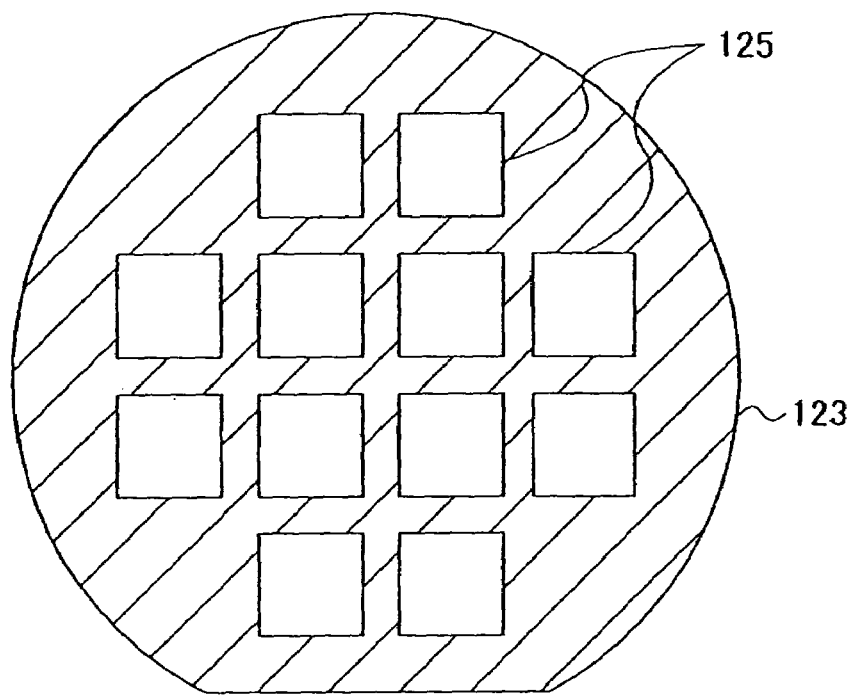
FIG. 53 is a plan view of a silicon wafer whereon individualized thin-film wiring layers are formed.
Figure 54:
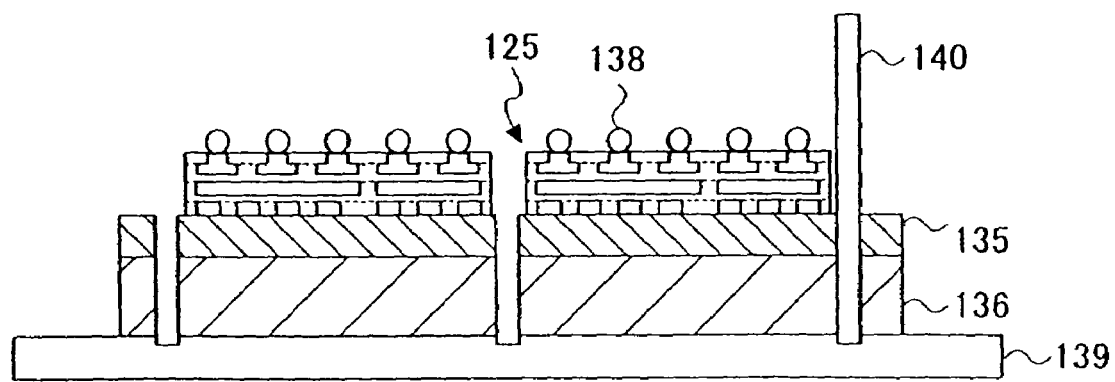
FIG. 54 is a diagram showing a step of dicing a supporting member whereon the thin-film wiring layer of FIG. 52 is attached.

Referring now to FIGS. 52 through 54, a method of forming the thin-film wiring layers 125 that are initially in an individualized state. FIG. 52 is a diagram showing an individualizing step in which the thin-film wiring layer is already divided in the step of forming the thin-film wiring layer. FIG. 53 is a plan view of a silicon wafer on which individualized thin-film wiring layers are formed. FIG. 54 is a diagram showing the step of dicing the supporting member where on the thin-film wiring layer shown in FIG. 52 is fixed.

In the embodiment described, the thin-film multilayer substrate 121 is formed by individualizing the thin-film wiring layers 125 by a dicing process. However, it is also possible to divide the thin-film wiring layer 125 into final sizes in the step of forming the thin-film wiring layer 125 on the silicon wafer 123. As shown in FIG. 52, upon forming the metal thin-film layer 124 and the thin-film wiring layer 125 on the silicon wafer 123, each of the layers are stacked with a desired sized by a technique such as photoetching. FIG. 53 is a plan view of the thin-film wiring layers formed in such a manner. That is, the metal thin-film layer 124 and the thin-film wiring layer 125 are not formed at parts to be finally cut by a dicing process.

The thin-film wiring layer 125 arranged on the silicon wafer 123 as shown in FIG. 53 (corresponds to the thin-film multilayer substrate 121) is attached to the supporting member 136 via the adhesive film 135, and the silicon wafer 123 and the metal thin-film layer 124 are removed by an etching process. Then, after forming the solder bumps 138 on the thin-film wiring layer 125, the supporting member 136 is diced and individualized as shown in FIG. 54. The supporting member 136 is cut along parts where the thin-film wiring layers 125 have not been formed.

Thus by forming the thin-film wiring layer 125 in an initially individualized state, an area of the thin-film wiring layer 125 that is connected as a single body is reduced. Therefore, a possibility of an occurrence of cracks in the thin-film wiring layer 125 upon removing the silicon wafer 123 by an etching process can be reduced. Also, since the thin-film wiring layer 135 will not be cut by a dicing process, damage due to a dicing process can be prevented.

Instead of forming the thin-film wiring layer 125 in an initially individualized manner, the thin-film wiring layer 125 may be individualized at a state where the thin-film wiring layer 125 is formed on the silicon wafer 123. FIGS. 55 through 59 are diagrams showing the steps of individualizing the thin-film wiring layer 125 while the thin-film wiring layer 125 is formed on the silicon wafer 123.

Figure 55:
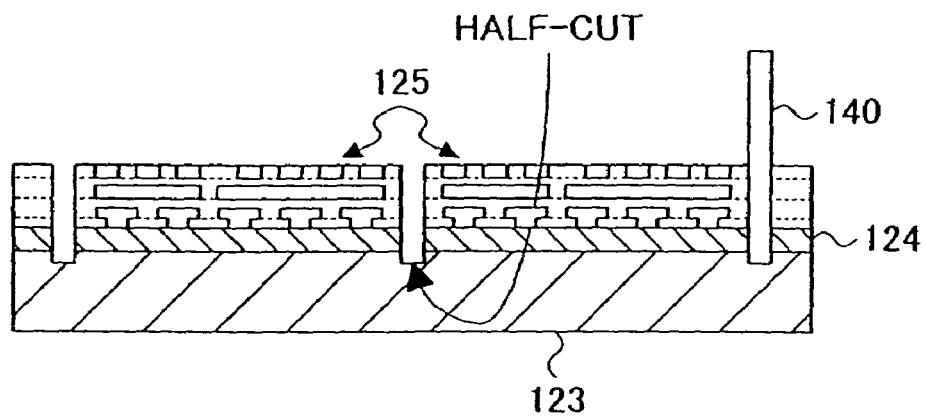
FIG. 55 is a diagram showing a first step of individualizing the thin-film wiring layer in a state where the thin-film wiring layer is formed on the silicon wafer.
Figure 56:
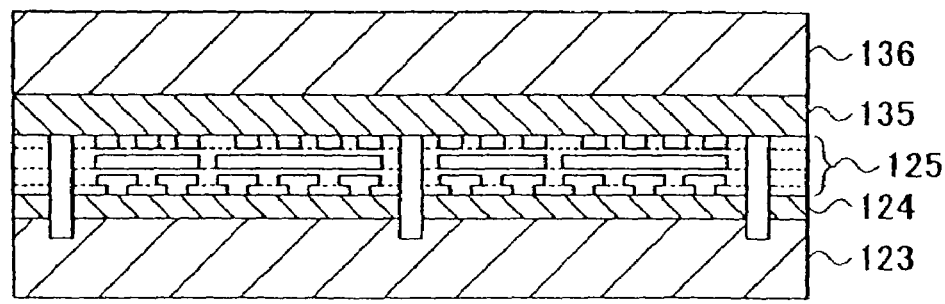
FIG. 56 is a diagram showing a second step of individualizing the thin-film wiring layer in a state where the thin-film wiring layer is formed on the silicon wafer.
Figure 57:
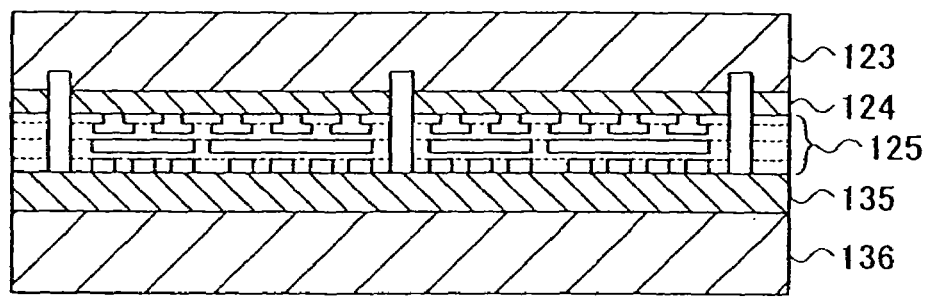
FIG. 57 is a diagram showing a third step of individualizing the thin-film wiring layer in a state where the thin-film wiring layer is formed on the silicon wafer.

As shown in FIG. 55, the thin-film wiring layer 125 formed on the silicon wafer 123 is individualized by a dicing process. The silicon wafer 123 is not completely cut but a slight cut is made in the silicon wafer 123 (half-cut). Then, as shown in FIG. 56, the supporting member 136 is attached to the thin-film wiring layer 125 by means of the adhesive film 135. Thereafter, as shown in FIG. 57, the thickness of the silicon wafer is reduced by a grinding process (back grinding). The back grinding process may be stopped before reaching the cut or may be continued until reaching the cut.

Figure 58:
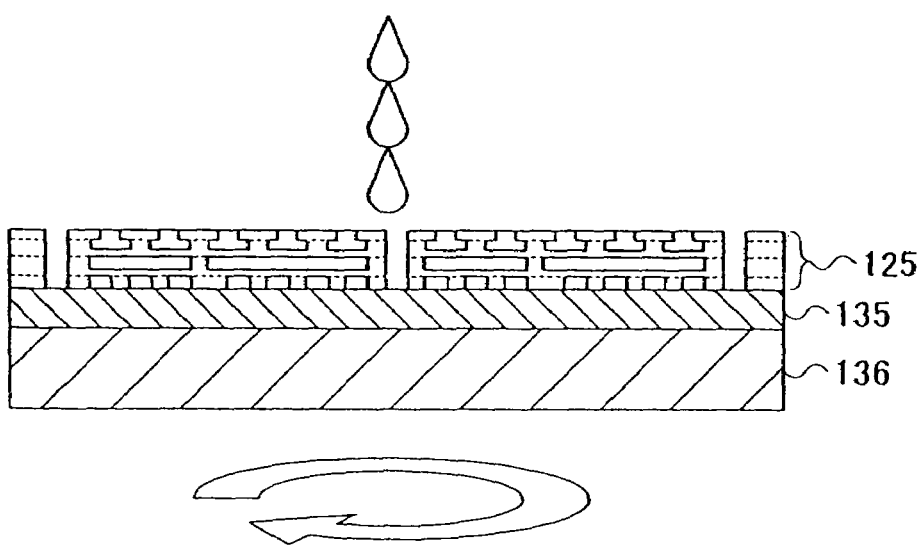
FIG. 58 is a diagram showing a fourth step of individualizing the thin-film wiring layer in a state where the thin-film wiring layer is formed on the silicon wafer.
Figure 59:
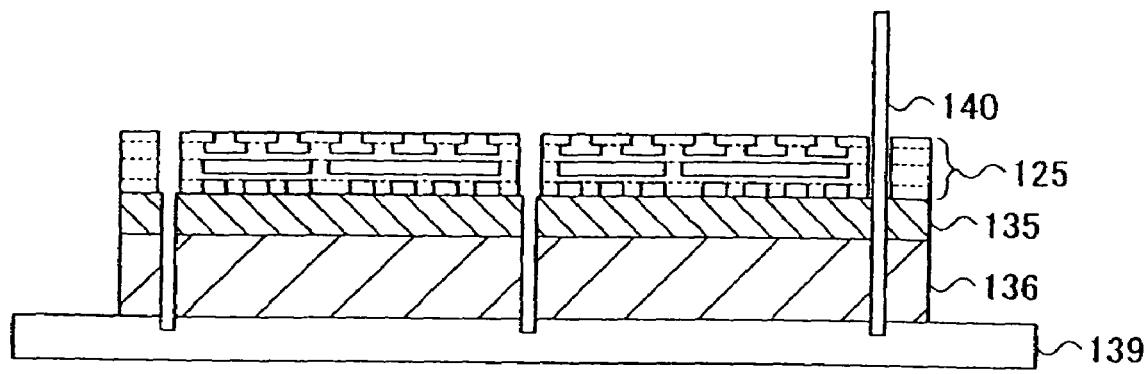
FIG. 59 is a diagram showing a fifth step of individualizing the thin-film wiring layer in a state where the thin-film wiring layer is formed on the silicon wafer.

Then, as shown in FIG. 58, the remaining silicon wafer 123 and the metal thin-film layer 124 are removed by a spin-etching process. Then, as shown in FIG. 59, with the dicing tape 139 being attached to the supporting member 136, the adhesive tape 135 and the supporting member 136 are cut and individualized by a dicing step. The dicer blade 140 is thinner than the dicer blade used for cutting the thin-film wiring layer 125 and dices along the line where the thin-film wiring layer 125 has been cut.

Thus by individualizing the thin-film wiring layer 125 in a state formed on the silicon wafer, an area of the thin-film wiring layer 125 that is connected as a single body is reduced. Therefore, the possibility of an occurrence of cracks in the thin-film wiring layer 125 upon removing the silicon wafer 123 by an etching process can be reduced.

Now, a method of testing the thin-film multilayer substrate formed according to the method described above will be described.

Figure 60:
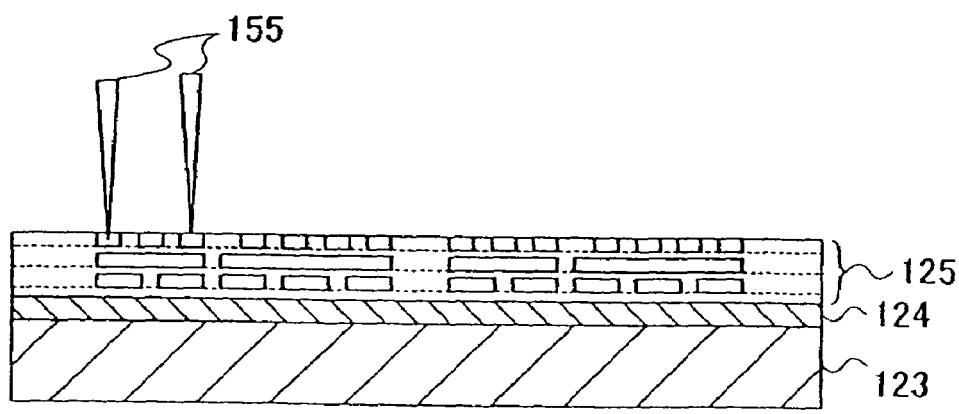
FIG. 60 is a diagram showing a method of testing the thin-film multilayer substrate during a manufacturing process of the semiconductor device.

First, as shown in FIG. 60, an electric conductivity test can be performed while the thin-film wiring layer 125 (corresponds to the thin-film multilayer substrate 121) is being formed on the silicon wafer 123. The silicon wafer 123 has a thickness of 500-700 μm and has rigidity. Therefore, a testing probe 155 can make contact with the upper electrodes of the thin-film wiring layer 125 in order to perform a check on electric conductivity. Thus, since a test may be carried out on a wafer, a large number of thin-film multilayer substrates 121 can be tested in an efficient manner.

Figure 61:
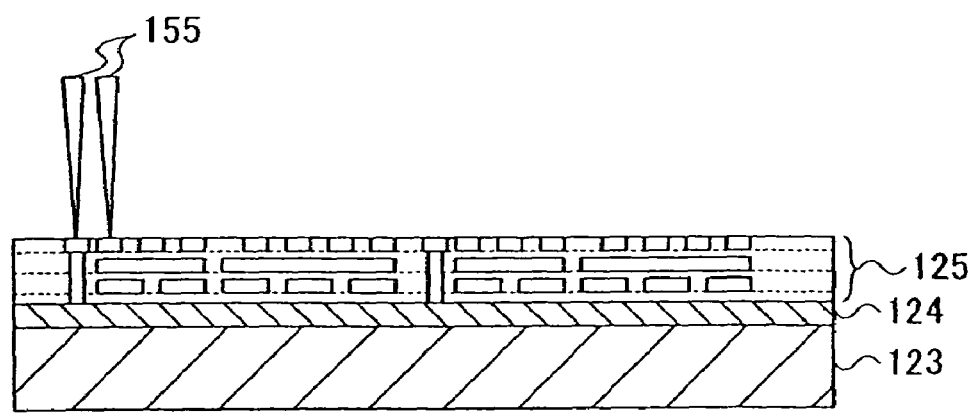
FIG. 61 is a diagram showing a method of testing the thin-film multilayer substrate during a manufacturing process of the semiconductor device.

Also, as shown in FIG. 61, conductive parts 125a are provided that penetrate through the thin-film wiring layer 125 and extend from the metal thin-film layer 124 to the opposite surface. The thin-film multilayer substrate 121 can be checked to determine whether it is good or bad by measuring the capacitance between the metal thin-film layer 124 and wiring layers on the surface of the thin-film wiring layer 125. In this case, the metal wiring layer 124 is eventually removed, and thus does not have any effect on the function of the thin-film multilayer substrate 121. Also, the thin-film wiring layer 125 may be provided on the conductive part 125a that is to be removed by a dicing process so as to remove the conductive part 125a by the dicing step for individualizing the thin-film wiring layer 125.

Figure 62:
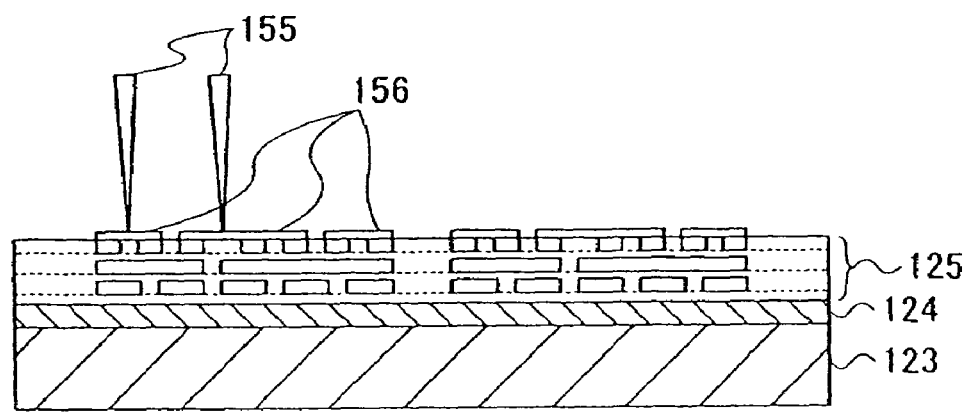
FIG. 62 is a diagram showing a method of testing the thin-film multilayer substrate during a manufacturing process of the semiconductor device.

Also, as shown in FIG. 62, after forming the thin-film wiring layer 125 (corresponds to the thin-film multilayer substrate 121) on the silicon wafer 121, a test wiring layer 156 may be formed on the thin-film wiring layer 125 to perform a predetermined test. The test wiring layer 156 may be formed by a sputtering process and removed by an etching process after completing the test.

Figure 63:
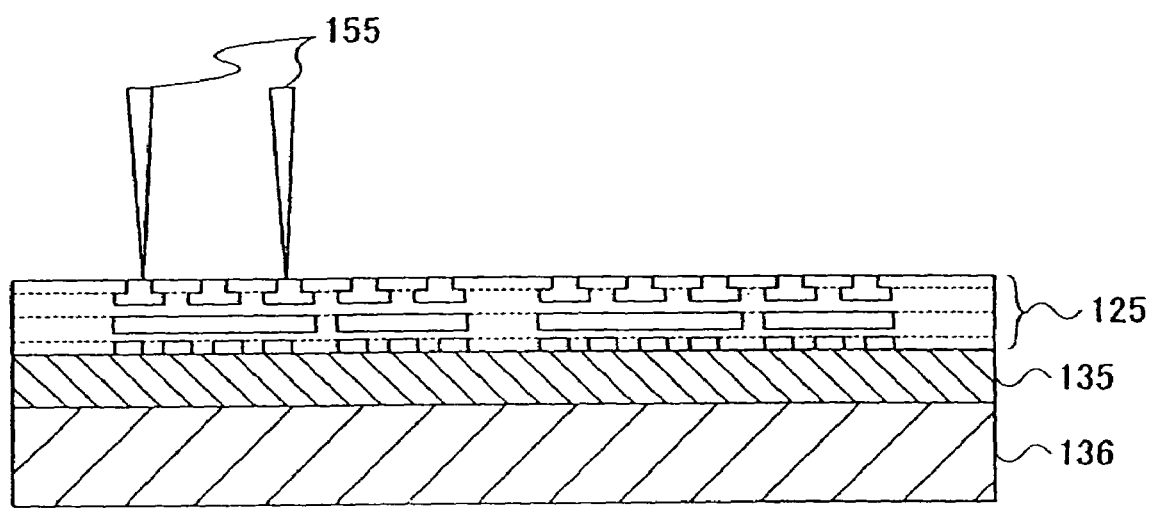
FIG. 63 is a diagram showing a method of testing the thin-film multilayer substrate during a manufacturing process of the semiconductor device.

Then, as shown in FIG. 63, after removing the silicon wafer 123 and the metal thin-film layer 124 by a spin-etching process, a test may be performed with the thin-film wiring layer 125 being attached to the supporting member 136. Also, in this case, since the supporting member 136 has rigidity, a testing probe 155 can make contact with the upper electrodes of the thin-film wiring layer 125 in order to perform a check on electric conductivity. Thus, in a manner similar to the above-described case for wafers, a large number of thin-film multilayer substrates 121 can be tested efficiently.

Further, the present invention is not limited to these embodiments, and variations and modifications may be made without departing from the scope of the present invention.

The present application is based on Japanese priority application Nos. 2002-151050 (filed on May 24, 2002) and 2002-235524 (filed on Aug. 13, 2002) the entire contents of which are hereby incorporated by reference.

The invention claimed is:

1. A method of manufacturing a semiconductor device using a wiring substrate, comprising the steps of:
    a) forming a peelable resin layer on a silicon substrate, said peelable resin layer having a lower adhesiveness to said silicon substrate and being easily peelable from said silicon substrate;
    b) forming the wiring substrate on said peelable resin layer;
    c) mounting a plurality of semiconductor chips on said wiring substrate;
    d) forming semiconductor devices by sealing said plurality of semiconductor chips by a sealing resin;
    e) thinning said silicon substrate by a grinding process;
    f) peeling said semiconductor devices from said silicon substrate with said peelable resin layer being separated from said thinned silicon substrate;
    g) individualizing said semiconductor devices by dicing said semiconductor devices; and
    h) exposing terminals provided on said wiring substrate by forming openings through said peelable resin layer or by removing said peelable resin layer.

2. The method of manufacturing the semiconductor device as claimed in claim 1, wherein said step d) is a step of sealing said plurality of semiconductor chips in a single step using molds and said resin sealing is carried out with an elastic sheet being provided along one of said molds at the backside of said semiconductor chip such that a distance between said wiring substrate and a surface of the sealing resin is less than a distance between said wiring substrate and the backside of said semiconductor chip.

3. A method of manufacturing a semiconductor device using a wiring substrate, comprising the steps of:
    a) forming a peelable resin layer on a silicon substrate, said peelable resin layer having a lower adhesiveness to the wiring substrate and being easily peelable from the wiring substrate;
    b) forming the wiring substrate on said peelable resin layer;
    c) mounting a plurality of semiconductor chips on said wiring substrate;

d) forming semiconductor devices by sealing said plurality of semiconductor chips by a sealing resin;
e) thinning said silicon substrate by a grinding process;
f) peeling said semiconductor devices from said silicon substrate wherein said peelable resin layer is peeled with said thinned silicon substrate such that said silicon substrate and said peelable resin layer are separated from the semiconductor devices; and
g) individualizing said semiconductor devices by dicing said semiconductor devices.

4. The method of manufacturing the semiconductor device as claimed in claim 3, wherein said step d) is a step of sealing said plurality of semiconductor chips in a single step using molds and said resin sealing is carried out with an elastic sheet being provided along one of said molds at the backside of said semiconductor chip such that a distance between said wiring substrate and a surface of the sealing resin is less than a distance between said wiring substrate and the backside of said semiconductor chip.

5. A method of manufacturing a semiconductor device using a wiring substrate, comprising the steps of:
a) forming a peelable resin layer on a silicon substrate, said peelable resin layer having a lower adhesiveness to a wiring substrate and being easily peelable from the wiring substrate;
b) forming the wiring substrate on said peelable resin layer;
c) mounting a plurality of semiconductor chips on said wiring substrate;
d) forming semiconductor devices by filling insulating resin between said plurality of semiconductor chips and said wiring substrate;
e) adhering a frame-like member on said silicon substrate such that said frame-like member surrounds each of said plurality of semiconductor chips, said frame-like member being made of a material having a higher rigidity than that of said wiring substrate;
f) thinning said silicon substrate by a grinding process;
g) peeling said semiconductor devices wherein said peelable resin layer is peeled with said thinned silicon substrate such that said wiring substrate and said peelable resin layer are separated; and
h) individualizing said semiconductor devices by dicing said semiconductor devices.

6. The method of manufacturing the semiconductor device as claimed in claim 5, wherein after the adhering of said frame-like members, resin is filled between said frame-lime members and said semiconductor chips.

7. A method of manufacturing a semiconductor device, comprising the steps of:
a) forming a metal thin-film layer on a silicon substrate;
b) forming a thin-film multilayer substrate by forming conductive layers and insulating layers in multiple levels on said metal thin-film layer;
c) attaching a supporting member on said thin-film multilayer substrate by means of an adhesive member;
d) removing said silicon substrate and said metal thin-film layer;
e) individualizing said thin-film multilayer substrate together with said supporting member;
f) mounting said thin-film multilayer substrate on a package substrate and fixing said thin-film multilayer substrate on said package substrate;
g) reducing adhesiveness of said adhesive member and peeling said supporting member and said adhesive member from said thin-film multilayer substrate; and
h) mounting at least one semiconductor chip on said thin-film multilayer substrate.

8. The method of manufacturing the semiconductor device as claimed in claim 7, wherein said adhesive member is provided with a thermal foam adhesive material on a surface that is in contact with said thin-film multilayer substrate, and, said step of peeling said adhesive member includes the step of heating said adhesive member to a temperature that is greater than or equal to a foaming-start temperature of said thermal foam adhesive material.

9. The method of manufacturing the semiconductor device as claimed in claim 7, wherein said adhesive member is provided with a UV curing type adhesive material on a surface that is in contact with said thin-film multilayer substrate, and, said step of peeling said adhesive member includes the step of irradiating an ultraviolet radiation on said adhesive member.

10. The method of manufacturing the semiconductor device as claimed in claim 7, wherein said supporting member is attached to said thin-film multilayer substrate by means of said adhesive member from the step of removing said silicon substrate from said thin-film multilayer substrate through the step of fixing and mounting said thin-film multilayer substrate on said package substrate.

11. The method of manufacturing the semiconductor device as claimed in claim 7, wherein in said step e), said thin-film multilayer substrate, said adhesive member and said supporting member are cut at the same time.

12. The method of manufacturing the semiconductor device as claimed in claim 7, wherein before said step c), only said thin-film multilayer substrate is cut and individualized while said thin-film multilayer substrate is fixed on said silicon substrate.

13. The method of manufacturing the semiconductor device as claimed in claim 7, wherein said step d) includes spin-etching using hydrofluoric-nitric acid.

14. The method of manufacturing the semiconductor device as claimed in claim 13, wherein said step e) includes a step of neutralizing hydrofluoric-nitric acid using a neutralizing agent after said spin-etching using hydrofluoric-nitric acid.

15. The method of manufacturing the semiconductor device as claimed in claim 13, wherein one of said insulating layers that is in contact with said metal thin-film layer is made of a material that has a greater flexibility as compared to the remaining insulating layers.

16. The method of manufacturing the semiconductor device as claimed in claim 13, wherein said steps a) and b) include forming said metal thin-film layer and said thin-film multilayer substrate on said silicon substrate such that said metal thin-film layer and said thin-film multilayer substrate are in a pre-individualized state.

17. The method of manufacturing the semiconductor device as claimed in claim 7, wherein one of said insulating layers that is in contact with said metal thin-film layer is made of a material that has a greater flexibility as compared to the remaining insulating layers.

18. The method of manufacturing the semiconductor device as claimed in claim 7, wherein said steps a) and b) include forming said metal thin-film layer and said thin-film multilayer substrate on said silicon substrate such that said metal thin-film layer and said thin-film multilayer substrate are in a pre-individualized state.

19. The method of manufacturing the semiconductor device as claimed in claim 7, wherein, after said step d), a laser beam is irradiated on said exposed insulating layer to form openings through said insulating layer such that said conductive layer is exposed in said openings.

20. The method of manufacturing the semiconductor device as claimed in claim 7, wherein, before removing said silicon substrate from said thin-film multilayer substrate, a test is implemented on said thin-film multilayer substrate.

21. The method of manufacturing the semiconductor device as claimed in claim 7, wherein, a test is implemented on said thin-film multilayer substrate while said thin-film multilayer is fixed on said supporting member.

22. A method of manufacturing a semiconductor device, comprising the steps of:
   a) forming a metal thin-film layer on a silicon substrate;
   b) forming a thin-film multilayer substrate by forming conductive layers and insulating layers in multiple levels on said metal thin-film layer;
   c) mounting at least one semiconductor chip on said thin-film multilayer substrate;
   d) resin sealing said semiconductor chip on said thin-film multilayer substrate;
   (e) thinning said silicon substrate by back-grind;
   (f) removing said silicon substrate and said metal thin-film layer after said back-grind;
   (g) individualizing said thin-film multilayer substrate; and
   (h) mounting said individualized thin-film multilayer substrate on a package substrate and fixing said thin-film multilayer substrate on said package substrate.

23. The method of manufacturing the semiconductor device as claimed in claim 22, wherein said step e) includes spin-etching using hydrofluoric-nitric acid.

24. The method of manufacturing the semiconductor device as claimed in claim 22, wherein, after said step d), a laser beam is irradiated on said exposed insulating layer to form openings through said insulating layer such that said conductive layer is exposed in said openings.

25. The method of manufacturing the semiconductor device as claimed in claim 22, wherein, before removing said silicon substrate from said thin-film multilayer substrate, a test is implemented on said thin-film multilayer substrate.

26. The method of manufacturing the semiconductor device as claimed in claim 25, wherein, conductive parts are formed that penetrate through said thin-film multilayer substrate and extend from said metal thin-film layer to the surface of said thin-film multilayer substrate, and
   a test is implemented on said thin-film multilayer substrate using said conductive parts and said conductive layers of said thin-film multilayer substrate.

27. The method of manufacturing the semiconductor device as claimed in claim 25, wherein,
   a test is implemented by forming a test wiring layer on the surface of said thin-film multilayer substrate while said thin-film multilayer substrate is fixed on said silicon substrate, and said test wiring layer is removed after the test.

* * * * *